(12) United States Patent
Manning et al.

(10) Patent No.: US 8,134,220 B2
(45) Date of Patent: Mar. 13, 2012

(54) TWO-TERMINAL NANOTUBE DEVICES INCLUDING A NANOTUBE BRIDGE AND METHODS OF MAKING SAME

(75) Inventors: H. Montgomery Manning, Eagle, ID (US); Thomas Rueckes, Rockport, MA (US); Jonathan W. Ward, Fairfax, VA (US); Brent M. Segal, Woburn, MA (US)

(73) Assignee: Nantero Inc., Woburn, MA (US)

( * ) Notice: Subject to any disclaimer, the term of this patent is extended or adjusted under 35 U.S.C. 154(b) by 856 days.

(21) Appl. No.: 12/139,910

(22) Filed: Jun. 16, 2008

(65) Prior Publication Data
US 2011/0057717 A1    Mar. 10, 2011

Related U.S. Application Data

(60) Provisional application No. 60/936,819, filed on Jun. 22, 2007.

(51) Int. Cl.
*G11C 11/00* (2006.01)
*H01L 23/52* (2006.01)
*H01L 21/02* (2006.01)

(52) U.S. Cl. . 257/529; 257/209; 257/530; 257/E21.005; 257/E23.147; 257/E23.149; 365/148; 438/131; 438/132; 977/943

(58) Field of Classification Search ............. 257/209, 257/529–530, E23.147, E23.149, E21.005, 257/E21.052–E21.053; 365/129, 148, 151; 977/943; 438/130–132, 139, 382, 467
See application file for complete search history.

(56) References Cited

U.S. PATENT DOCUMENTS

| | | | |
|---|---|---|---|
| 4,979,149 A | 12/1990 | Popovic et al. | |
| 5,267,193 A * | 11/1993 | Lin | 365/168 |
| 6,128,214 A | 10/2000 | Kuekes et al. | |
| 6,256,767 B1 | 7/2001 | Kuekes et al. | |
| 6,314,019 B1 | 11/2001 | Kuekes et al. | |
| 6,362,660 B1 * | 3/2002 | Deng | 326/134 |
| 6,422,450 B1 | 7/2002 | Zhou et al. | |

(Continued)

FOREIGN PATENT DOCUMENTS

GB    2 364 933 A    2/2002

(Continued)

OTHER PUBLICATIONS

Avouris, P., et al., "Carbon Nanotube Electronics," Chemical Physics, 2002, vol. 284, pp. 429-445.

(Continued)

*Primary Examiner* — Matthew W Such
(74) *Attorney, Agent, or Firm* — Nantero Inc.

(57) ABSTRACT

Nanotube switching devices having nanotube bridges are disclosed. Two-terminal nanotube switches include conductive terminals extending up from a substrate and defining a void in the substrate. Nantoube articles are suspended over the void or form a bottom surface of a void. The nanotube articles are arranged to permanently contact at least a portion of the conductive terminals. An electrical stimulus circuit in communication with the conductive terminals is used to generate and apply selected waveforms to induce a change in resistance of the device between relatively high and low resistance values. Relatively high and relatively low resistance values correspond to states of the device. A single conductive terminal and a interconnect line may be used. The nanotube article may comprise a patterned region of nanotube fabric, having an active region with a relatively high or relatively low resistance value. Methods of making each device are disclosed.

41 Claims, 25 Drawing Sheets

U.S. PATENT DOCUMENTS

| | | | |
|---|---|---|---|
| 6,423,583 B1 * | 7/2002 | Avouris et al. | 438/132 |
| 6,445,006 B1 | 9/2002 | Brandes et al. | |
| 6,528,020 B1 | 3/2003 | Dai et al. | |
| 6,548,841 B2 | 4/2003 | Frazier et al. | |
| 6,574,130 B2 | 6/2003 | Segal et al. | |
| 6,643,165 B2 | 11/2003 | Segal et al. | |
| 6,706,402 B2 | 3/2004 | Rueckes et al. | |
| 6,707,098 B2 | 3/2004 | Hofmann et al. | |
| 6,759,693 B2 | 7/2004 | Vogeli et al. | |
| 6,784,028 B2 * | 8/2004 | Rueckes et al. | 438/128 |
| 6,803,840 B2 | 10/2004 | Hunt et al. | |
| 6,808,746 B1 | 10/2004 | Dai et al. | |
| 6,809,465 B2 | 10/2004 | Jin | |
| 6,835,591 B2 | 12/2004 | Rueckes et al. | |
| 6,837,928 B1 * | 1/2005 | Zhang et al. | 117/95 |
| 6,888,773 B2 | 5/2005 | Morimoto | |
| 6,890,780 B2 | 5/2005 | Lee | |
| 6,894,359 B2 | 5/2005 | Bradley et al. | |
| 6,899,945 B2 | 5/2005 | Smalley et al. | |
| 6,905,892 B2 | 6/2005 | Esmark et al. | |
| 6,911,682 B2 | 6/2005 | Rueckes et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 6,924,538 B2 | 8/2005 | Jaiprakash et al. | |
| 6,979,244 B2 * | 12/2005 | Den et al. | 445/24 |
| 6,990,009 B2 | 1/2006 | Bertin et al. | |
| 7,015,500 B2 | 3/2006 | Choi et al. | |
| 7,056,758 B2 * | 6/2006 | Segal et al. | 438/50 |
| 7,115,901 B2 | 10/2006 | Bertin et al. | |
| 7,115,960 B2 | 10/2006 | Bertin | |
| 7,161,403 B2 | 1/2007 | Bertin | |
| 7,781,862 B2 | 8/2010 | Bertin et al. | |
| 7,835,170 B2 | 11/2010 | Bertin et al. | |
| 2001/0023986 A1 | 9/2001 | Mancevski | |
| 2002/0167374 A1 * | 11/2002 | Hunt et al. | 333/186 |
| 2002/0173083 A1 | 11/2002 | Avouris et al. | |
| 2002/0175390 A1 | 11/2002 | Goldstein et al. | |
| 2003/0026126 A1 * | 2/2003 | Uemura | 365/159 |
| 2003/0200521 A1 | 10/2003 | DeHon et al. | |
| 2004/0031975 A1 | 2/2004 | Kern et al. | |
| 2004/0043527 A1 | 3/2004 | Bradley et al. | |
| 2004/0132070 A1 | 7/2004 | Star et al. | |
| 2004/0175856 A1 | 9/2004 | Jaiprakash et al. | |
| 2004/0181630 A1 | 9/2004 | Jaiprakash et al. | |
| 2004/0266106 A1 | 12/2004 | Lee | |
| 2005/0035367 A1 | 2/2005 | Bertin et al. | |
| 2005/0036365 A1 | 2/2005 | Bertin et al. | |
| 2005/0056877 A1 | 3/2005 | Rueckes et al. | |
| 2005/0062035 A1 | 3/2005 | Bertin et al. | |
| 2005/0128788 A1 | 6/2005 | Segal et al. | |
| 2005/0212014 A1 | 9/2005 | Horibe et al. | |
| 2006/0237537 A1 | 10/2006 | Empedocles et al. | |
| 2006/0250843 A1 | 11/2006 | Bertin et al. | |
| 2006/0250856 A1 | 11/2006 | Bertin et al. | |
| 2006/0258122 A1 | 11/2006 | Whitefield et al. | |
| 2006/0264053 A1 | 11/2006 | Yates | |
| 2006/0281256 A1 | 12/2006 | Carter et al. | |
| 2006/0281287 A1 | 12/2006 | Yates et al. | |
| 2006/0292716 A1 | 12/2006 | Gu et al. | |
| 2008/0157126 A1 | 7/2008 | Bertin | |
| 2008/0159042 A1 | 7/2008 | Bertin | |

FOREIGN PATENT DOCUMENTS

| | | |
|---|---|---|
| WO | WO-00/48195 | 8/2000 |
| WO | WO-01/03208 A1 | 1/2001 |

OTHER PUBLICATIONS

Bachtold, A. et al., "Logic Circuits with Carbon Nanotube Transistors", *Science*, Nov. 9, 2001, vol. 294, pp. 1317-1320.

Johnson, R. Colin, "IBM fellow unrolls blueprint for nano", *EETimes*, Mar. 6, 2006, 3 pages, http://www.eetimes.com/showArticle.jhtml?articleID=181500304.

Collins, P. G. et al., "Engineering Carbon Nanotubes and Nanotube Circuits Using Electrical Breakdown", *Science*, vol. 292, pp. 706-709, Apr. 27, 2001.

Hone, J., "Phonons and Thermal Properties of Carbon Nanotubes", *Carbon Nanotubes, Topics Appl. Phys.*, vol. 80, pp. 273-286, 2001.

Kong, J. et al., "Quantum Interference and Ballistic Transmission in Nanotube Electron Waveguides", *The American Physical Society*, vol. 87, No. 10, pp. 106801-1-106801-4, Sep. 3, 2001.

Chen, J. et al., "Self-aligned carbon nanotube transistors with charge transfer doping", *Applied Physics Letters*, vol. 86, pp. 123108-1-123108-3, 2005.

Chen, J. et al., "Self-aligned Carbon Nanotube Transistors with Novel Chemical Doping", *IEDM*, pp. 29.4.1-29.4.4, 2004.

Derycke, V. et al., "Controlling doping and carrier injection in carbon nanotube transistors", *Applied Physics Letters*, vol. 80, No. 15, pp. 2773-2775, Apr. 15, 2002.

Duan, X. et al., "Nonvolatile Memory and Programmable Logic from Molecule-Gated Nanowires", *Nano Letters*, vol. 0, No. 0, pp. A-D, 2002.

Heinze, S. et al., "Carbon Nanotubes as Schottky Barrier Transistsors", *Physical Review Letters*, vol. 89, No. 10, pp. 16801-1-106801-4, 2002.

Radosavljevic, M. et al., "Nonvolatile Molecular Memory Elements Based on Ambipolar Nanotube Field Effect Transistors", *Nano Letters*, vol. 2, No. 7, pp. 761-764, 2002.

Onoa et al., "Bulk Production of singly dispersed carbon nanotubes with prescriped lengths", *Nanotechnology*, vol. 16, pp. 2799-2803, 2005.

Rueckes, et al., "Carbon nanotube-based nonvolatile random access memory for molecular computing", *Science*, vol. 289, pp. 94-97, Jul. 7, 2000.

Huang, Y., et al, "Logic Gates and Computation from Assembled Nanowire Building Blocks," *Science* (2001) 294(9):1313-1317.

Javey, A., et al, "Carbon Nanotube Transistor Arrays for Multistage Complementary Logic and Ring Oscillators," *Nano Letters*, (2002) vol. 0, No. 0-A-D.

Javey, A., et al, "Carbon Nanotube Field-Effect Transistors with Integrated Ohmic Contacts and High-κ Gate Dielectrics," *Nano Letters* (2004) 4(3): 447-450.

Javey, A., et al, "High-κ Dielectrics for Advanced Carbon-Nanotube Transistors and Logic Gates," *Nature Materials* (2002) 1:241-246.

Lin, Y., et al, "Novel Carbon Nanotube FET Design with Tunable Polarity," *IEDM* (2004) 4:687-690.

Martel, R., et al, "Carbon Nanotube Field-Effect Transistors and Logic Circuits," *DAC* 2002.

Wind, S., et al, "Vertical Scaling of Carbon Nanotube Field-Effect Transistors Using Top Gate Electrodes," *Applied Physics Letters* (2002), 80(20):3817-3819.

Wind, S., et al, "Fabrication and Electrical Characterization of Top Gate Single-Wall Carbon Nanotube Field-Effect Transistors," IBM T.J. Watson Research Center, 6A1:1-9 plus figures 1-5.

International Search Report and Written Opinion, International Application No. PCT/US2008/067120, Nantero, Inc., Sep. 29, 2008, 10 pages.

Derycke, V., et al., "Carbon Nanotube Inter- and Intramolecular Logic Gates," *Nano Letters*, Sep. 2001, vol. 1, No. 9, pp. 453-456.

Langer, L. et al., "Electrical Resistance of a Carbon Nanotube Bundle," *J. Mater. Res.* vol. 9, No. 4, Apr. 1994, pp. 927-932.

Cui, J.B. et al., "Carbon nanotube memory devices of high charge storage stability," *Applied Physics Letters*, vol. 81, No. 17, Oct. 21, 2002, pp. 3260-3262.

Fuhrer, M.S. et al., "High-Mobility Nanotube Transistor Memory," *Nano Letters*, 2002, vol. 2, No. 7, pp. 755-759.

Star, A. et al., "Nanoelectronic Carbon Dioxide Sensors," *Adv. Mater.* 2004, 16, No. 22, Nov. 18, pp. 2049-2052.

Star, A. et al., "Nanotube Optoelectronic Memory Devices," *Nano Letters*, 2004, vol. 4, No. 9, pp. 1587-1591.

Novak, J.P. et al., "Nerve agent detection using networks of single-walled carbon nanotubes," *Applied Physics Letters*, Volumber 83, No. 19, Nov. 10, 2003, pp. 4026-4028.

Zhou, Y. et al., "p-Channel, n-Channel Thin Film Transistors and p-n Diodes Based on Single Wall Carbon Nanotube Networks," *Nano Letters*, 2004, vol. 4, No. 10, pp. 2031-2035.

Snow, E.S. et al., "Random networks of carbon nanotubes as an electronic material," *Applied Physics Letters*, vol. 82, No. 13, Mar. 31, 2003, pp. 2145-2147.

Kianian, S. et al., "A 3D Stackable Carbon Nanotube-based Nonvolatile Memory (NRAM)," ESSDERC, Jun. 14, 2010, Nantero, Inc., 4 pages.

Awano, Y., "Graphene for VLSI: FET and Interconnect Applications" IEDM 2009 Technical Digest, pp. 10.1.1-10.1.4.

Jiang, Y. et al., "Performance Breakthrough in 8nm Gate-All-Around Length Gate-All-Around Nanowire Transistors using Metallic Nanowire Contacts" 2008 Symposium on VLSI Technology Digest of Technical Papers, pp. 34-35.

Huai, Y. "Spin-Transfet Torque MRAM (STT-MTAM): Challenges and Prospects" AAPS Bulletin Dec. 2008, vol. 18, No. 6, pp. 33-40.

Crowley, M. et al., "512 Mb PROM with 8 layers of antifuse/Diode cells," IEEE International Solid-State Circuits Conference, vol. XLVI, pp. 284-285, Feb. 2003.

Brown, K.M. "System in package "The Rebirth of SIP"," 2004 IEEE Custom Integrated Circuits Conference, May 2004, 6 pages.

Servalli, G. "A 45nm Generation Phase Change Memory Technology," IEDM 2009 Technical Digest, pp. 5.7.1-5.7.4.

Appenzeller, J., et al., "Optimized contact configuration for the study of transport phenomena in ropes of single-wall carbon nanotubes," Applied Physical Letters, vol. 78, No. 21, 2001, pp. 3313-3315.

Hertel, et al., "Deformation of carbon nanotubes by surface van der Waals forces," Physical Review B, vol. 58, No. 20, 1998, pp. 13870-13873.

* cited by examiner

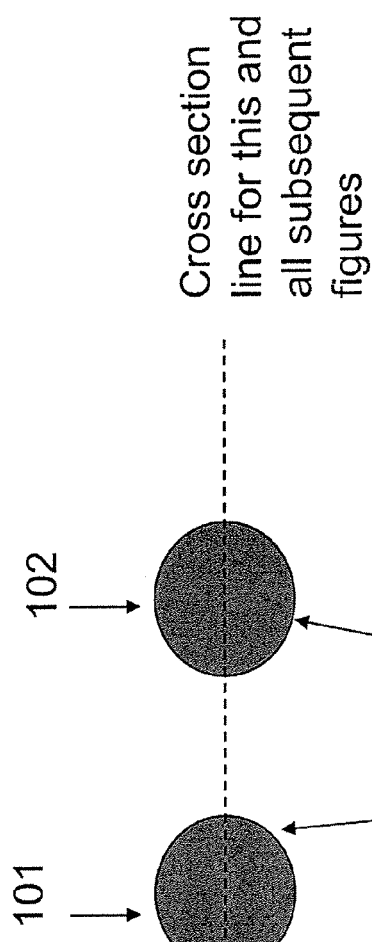
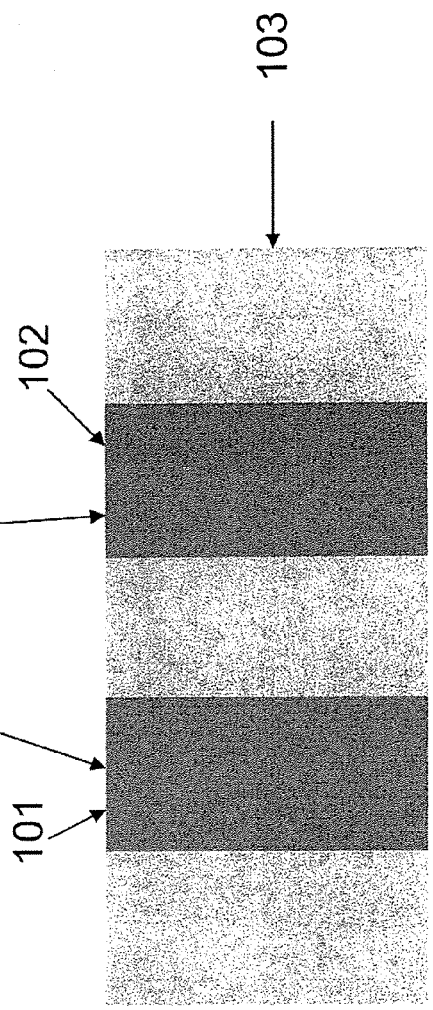
Figure 1
Fig 1 A
Top View
Fig 1 B
Cross Section

Figure 3
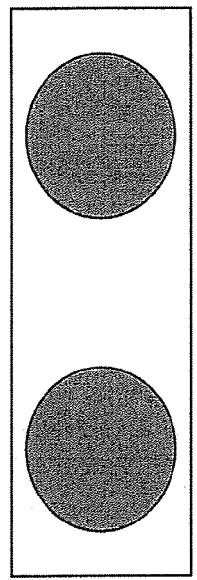
Fig 3A
Top View
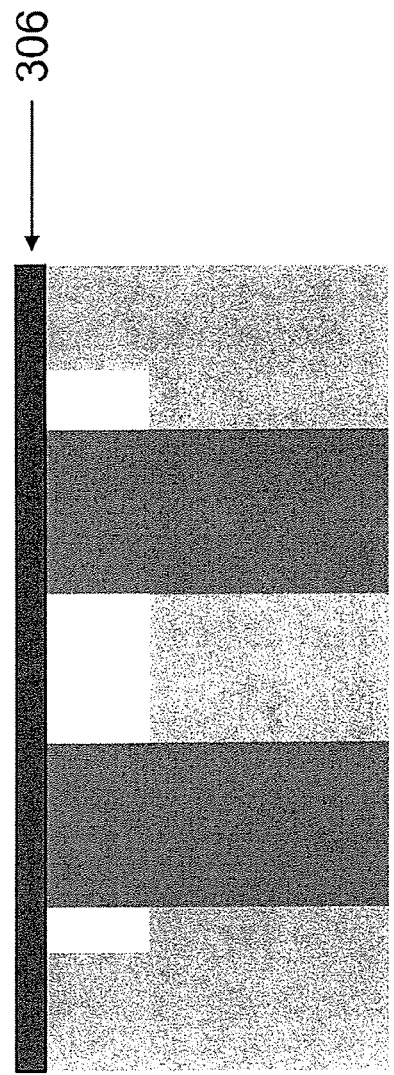
Fig 3B
Cross Section

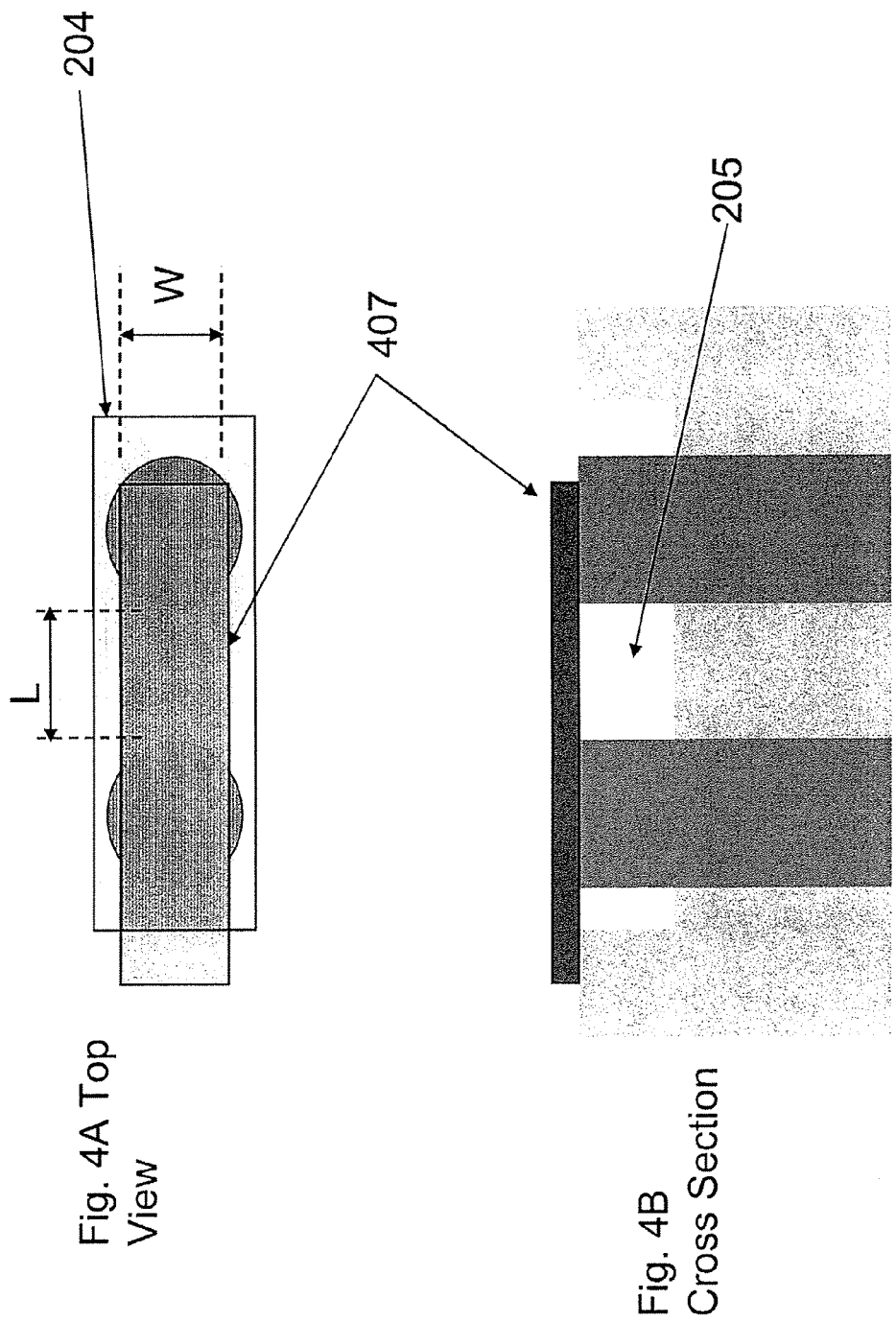

Top View

Fig. 5B Cross Section

Figure 6
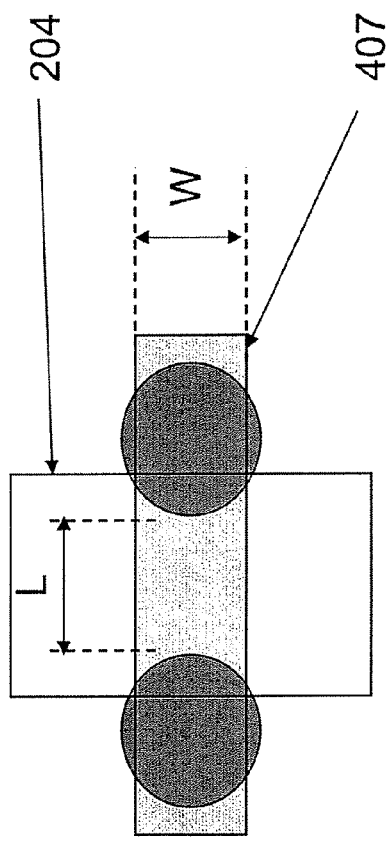
Fig. 6A
Top View
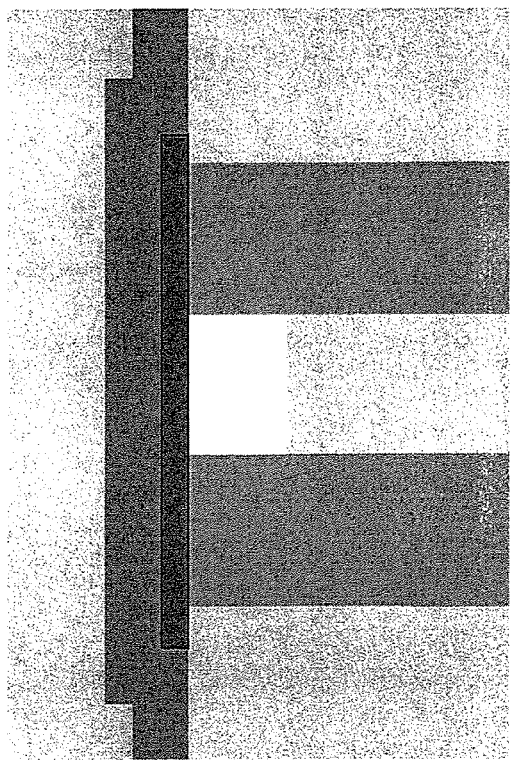
Fig. 6B
Cross Section

Figure 7
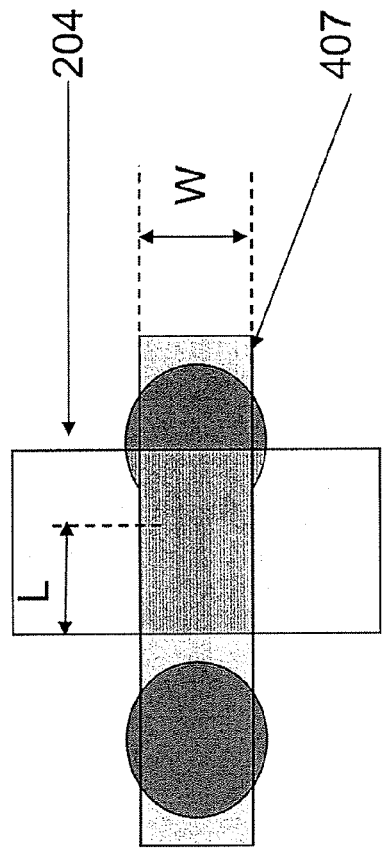
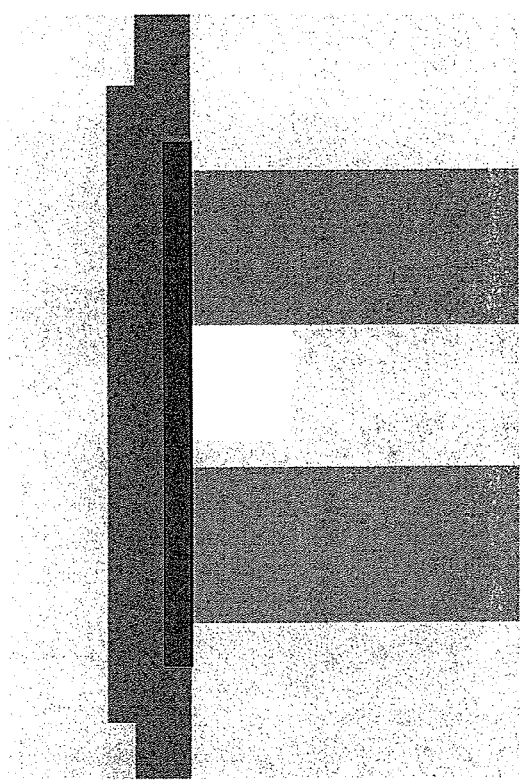
Fig. 7A
Top View
Fig 7B
Cross Section

Figure 8
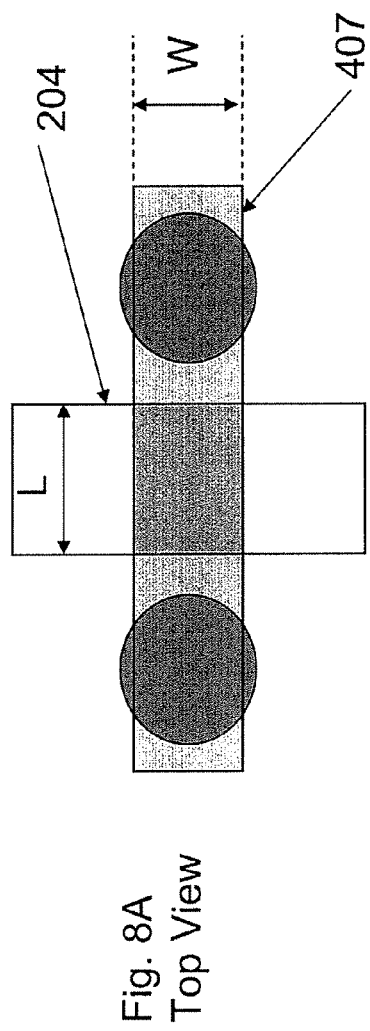
Fig. 8A
Top View
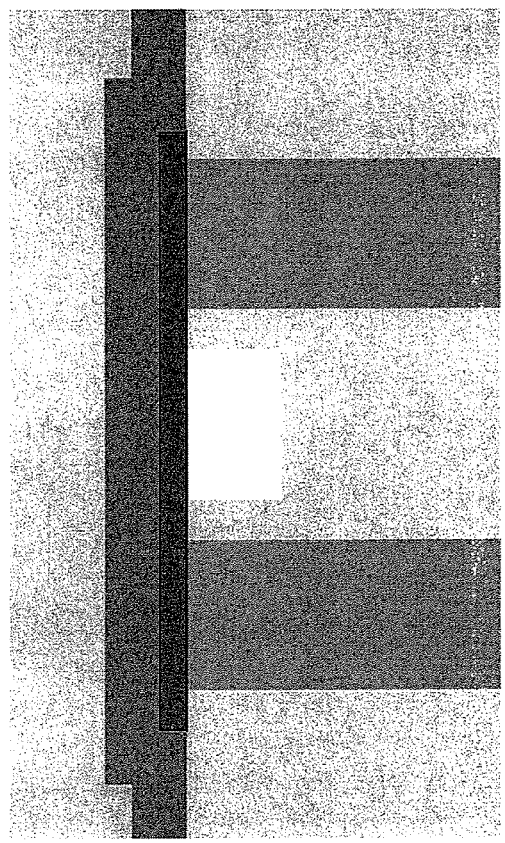
Fig. 8B
Cross Section

Figure 9
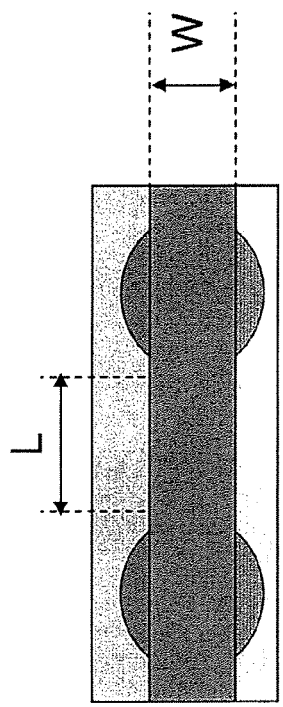
Fig. 9A
Top View
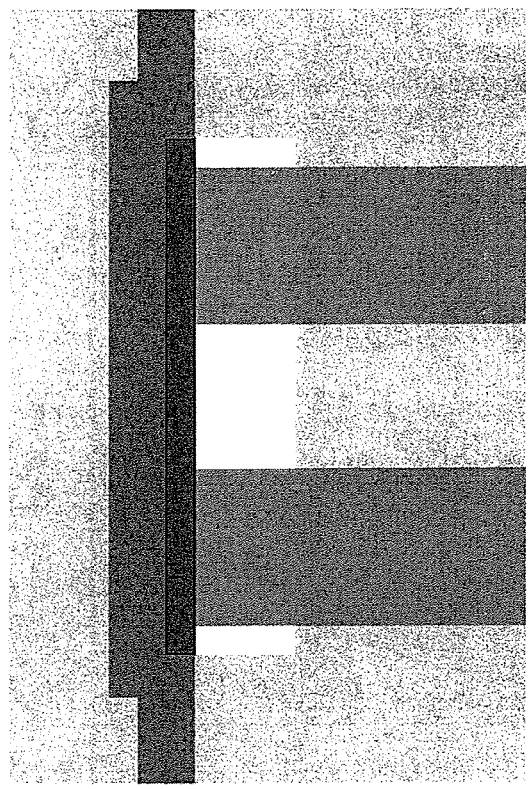
Fig. 9B
Cross Section

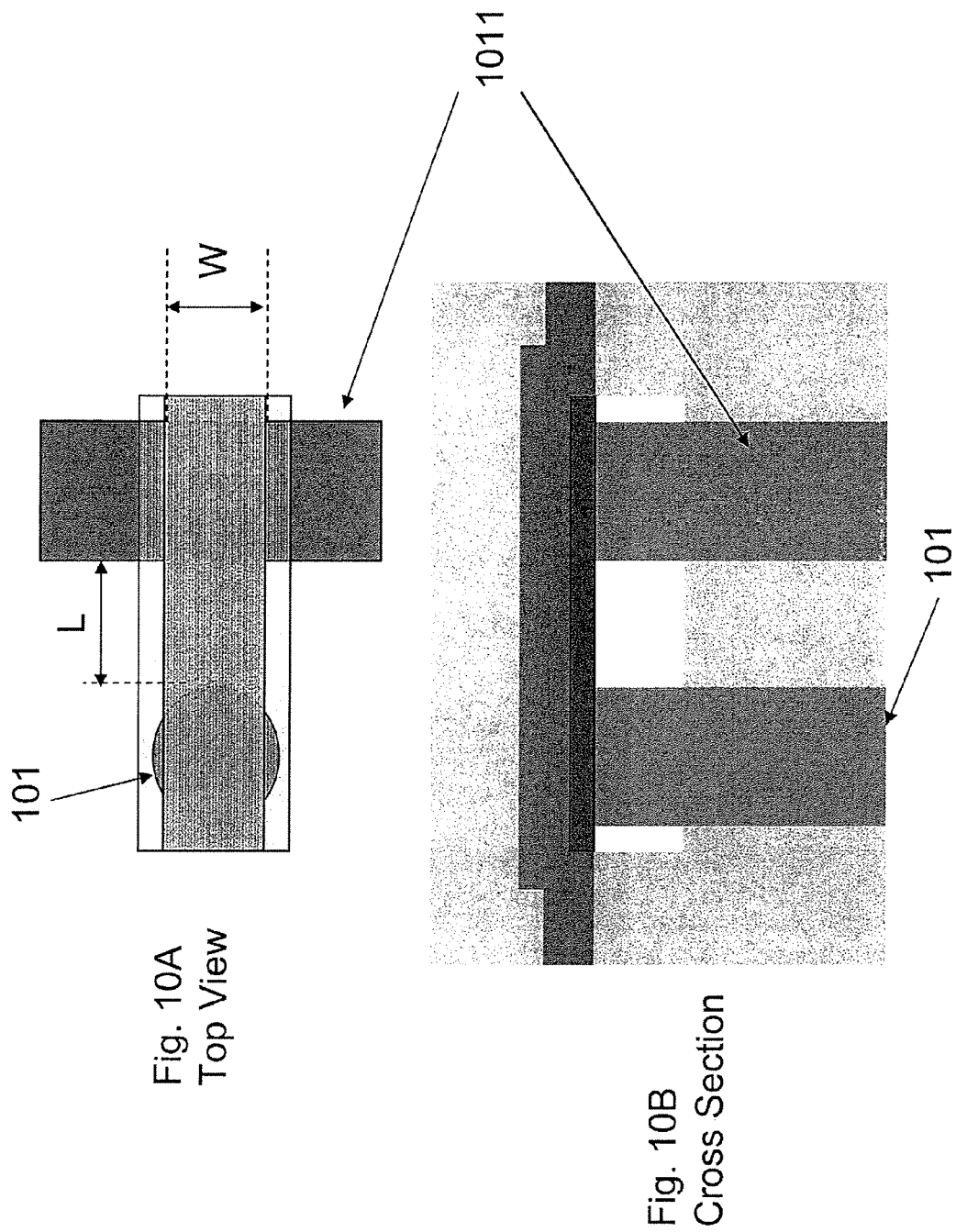

Figure 11
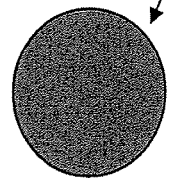
Fig. 11A
Top View
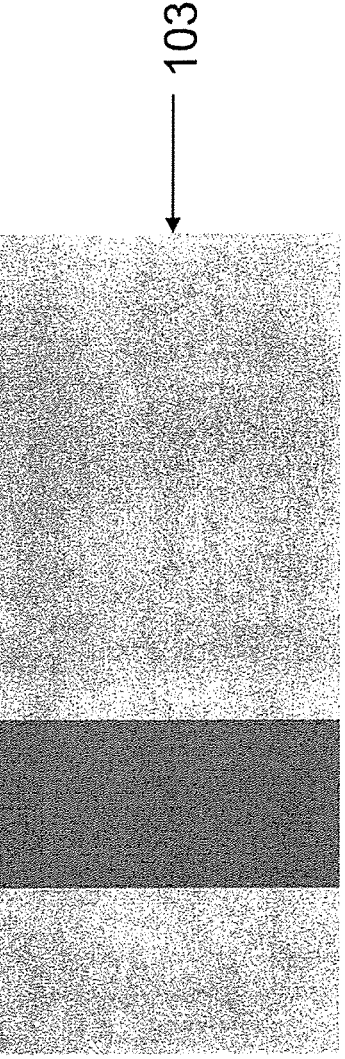
Fig. 11B
Cross Section

Top View

Cross Section

Top View

Cross Section

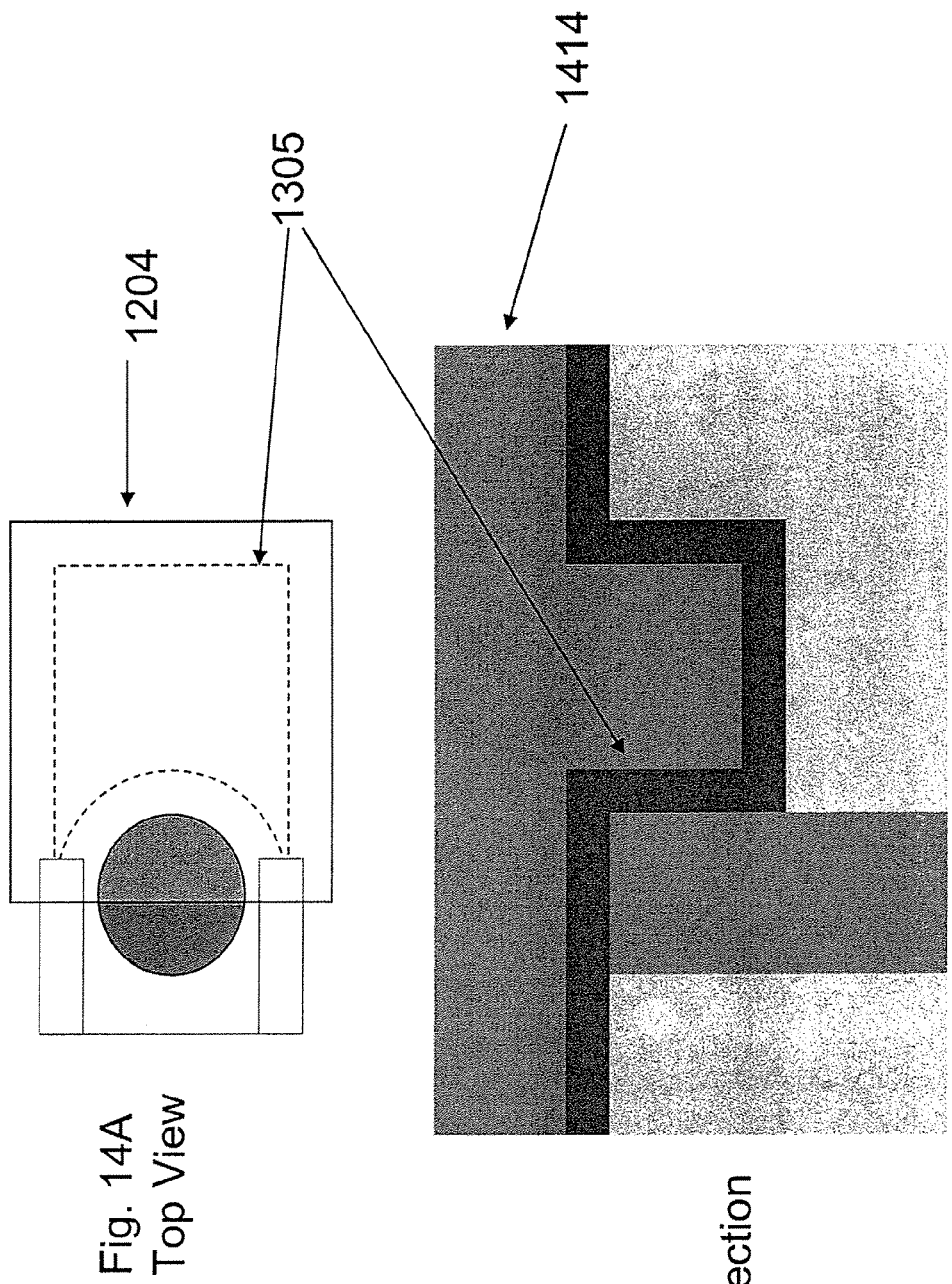

Figure 15
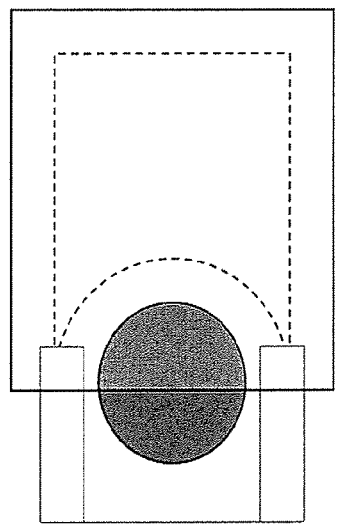
Fig. 15A
Top View
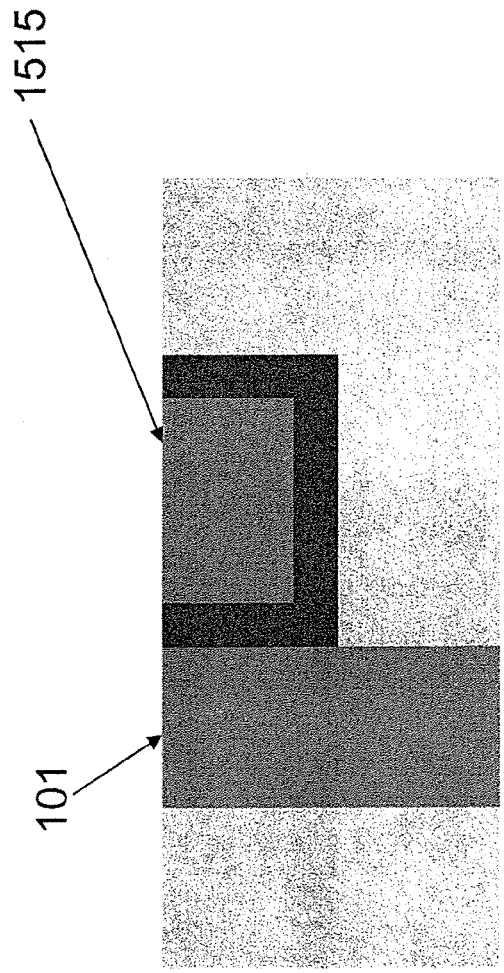
Fig. 15B
Cross Section

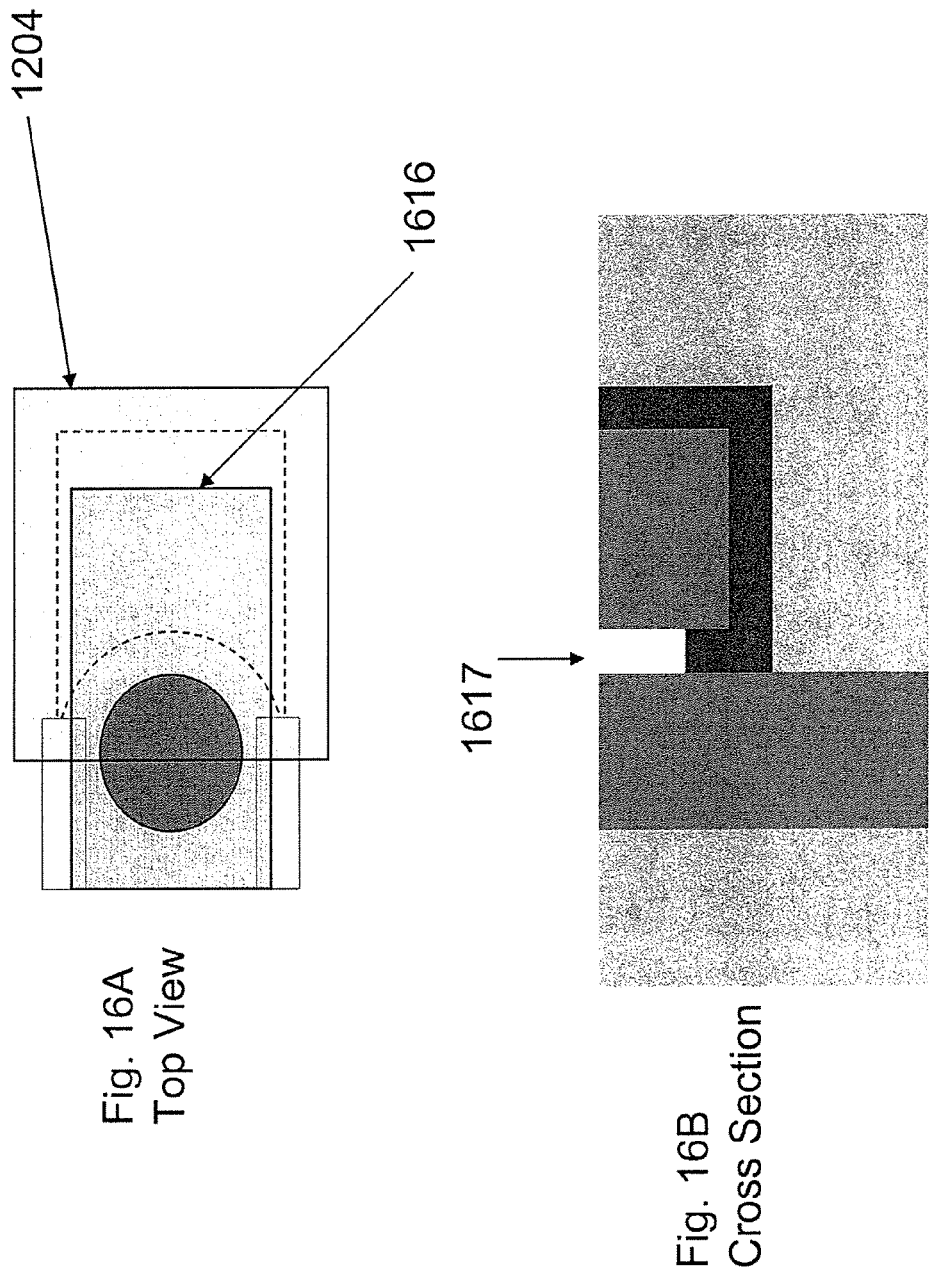

Top View

Cross Section

Fig. 18A Top View

Fig. 18B Cross Section

Fig. 19A Top View

Fig. 19B Cross Section

407

Figure 20
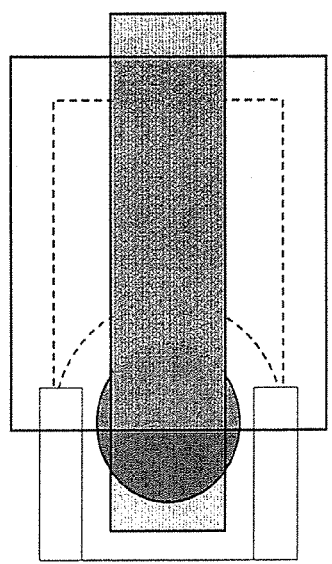
Fig. 20A
Top View
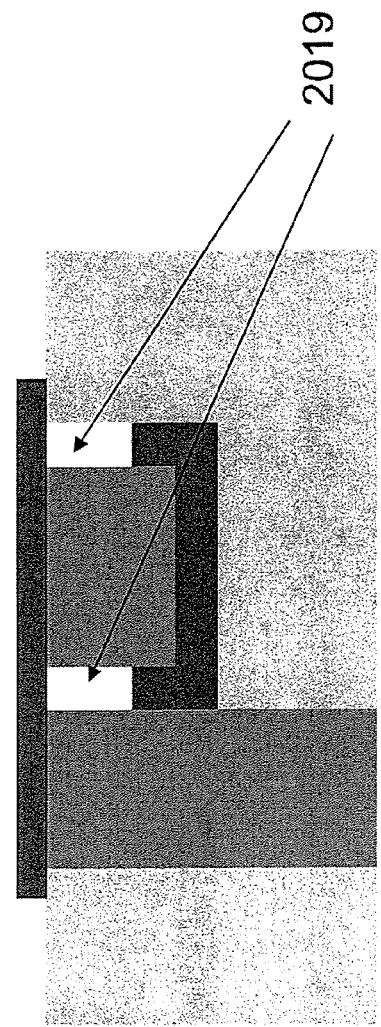
Fig. 20B
Cross Section

Figure 21
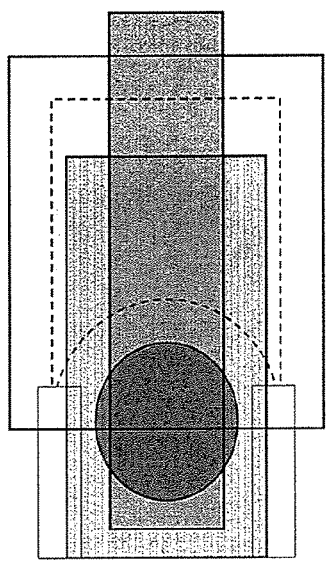
Fig. 21A
Top View
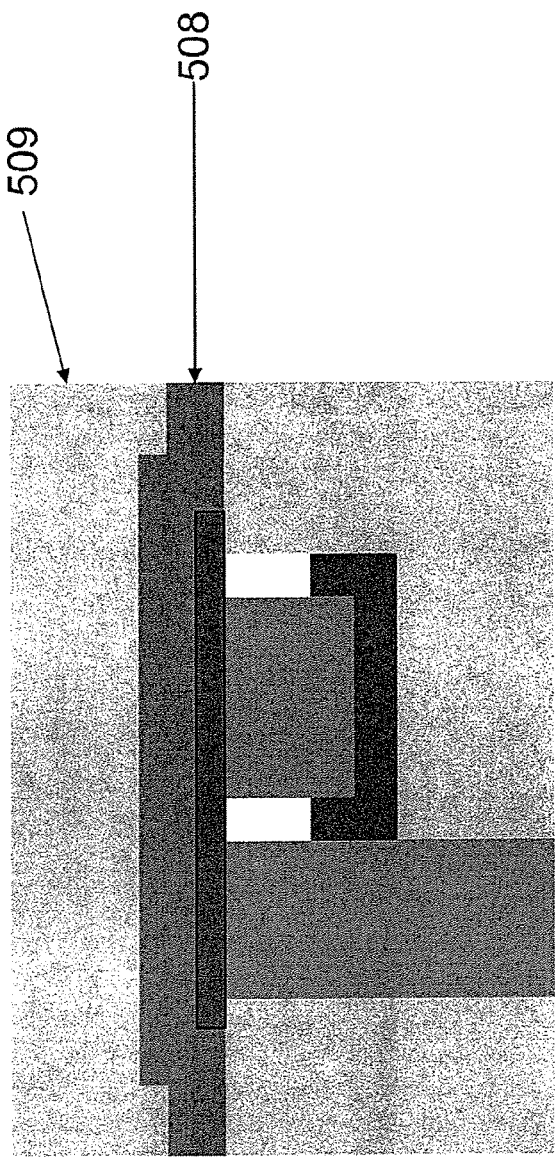
Fig. 21B
Cross Section

Figure 22, cont.

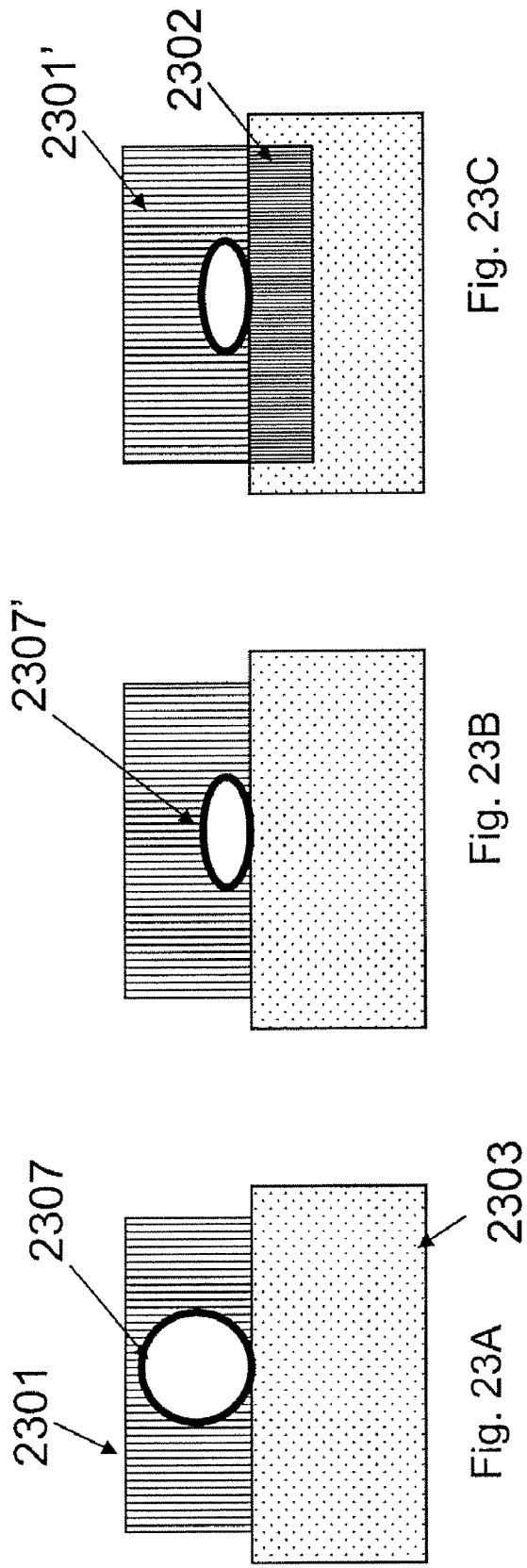

Figure 24
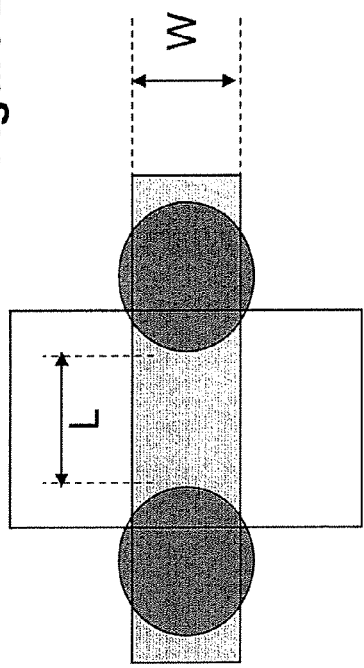
Fig. 24A
Top View
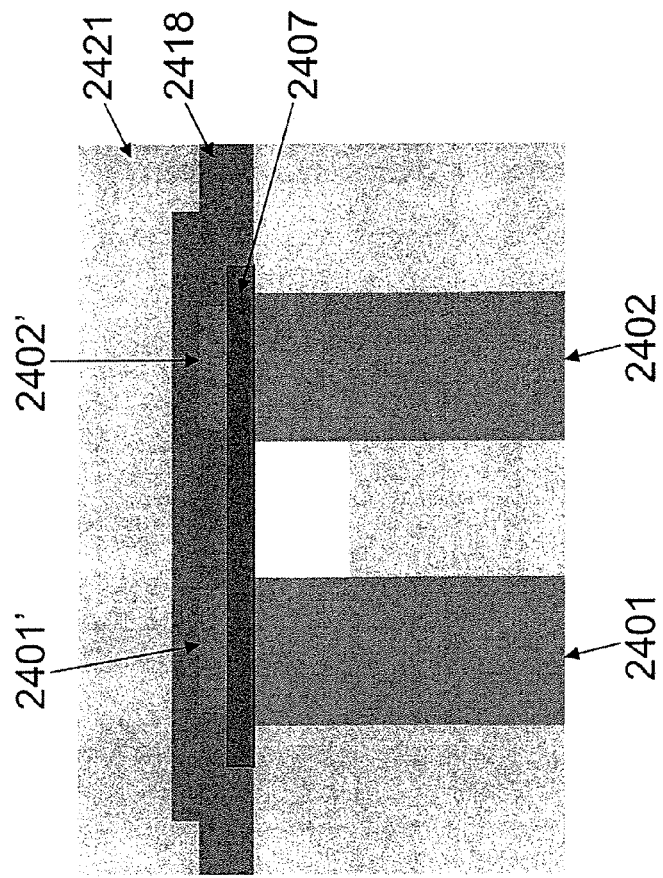
Fig. 24B
Cross Section

TWO-TERMINAL NANOTUBE DEVICES INCLUDING A NANOTUBE BRIDGE AND METHODS OF MAKING SAME

CROSS-REFERENCE TO RELATED APPLICATIONS

This application claims priority under 35 U.S.C. 119(e) to the following application, the entire contents of which are incorporated herein by reference:

U.S. Provisional Patent Application No. 60/936,819, entitled "Two-Terminal Nanotube Devices Including a Nanotube Bridge," filed on Jun. 22, 2007.

This application is related to the following applications, the contents of which are incorporated herein in their entirety by reference:

U.S. patent application Ser. No. 11/280,786, filed on Nov. 15, 2005, entitled Two-Terminal Nanotube Devices and Systems and Methods of Making Same, U.S. patent application Ser. No. 10/128,188, filed on Apr. 23, 2002, entitled Nanotube Films and Articles, now U.S. Pat. No. 6,706,402, and U.S. patent application Ser. No. 10/128,117, filed on Apr. 23, 2002, entitled Methods of Nanotube Films and Articles, now U.S. Pat. No. 6,835,591.

BACKGROUND

1. Technical Field

The present application is generally related to the field of switching devices and, more specifically, to devices including a nanotube element that may be used to make nonvolatile and other electronic circuits.

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or extreme environment. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to extreme environment because they may generate electrical currents inside the semiconductor material. It is possible to manufacture integrated circuits with special devices and isolation techniques so that they remain operational when exposed to extreme environment, but the high cost of these devices limits their availability and practicality. In addition, such digital circuits exhibit timing differences from their normal counterparts, requiring additional design verification to add protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul. 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a junction. When electrical power is removed from the junction, the wires retain their physical (and thus electrical) state thereby forming a non-volatile memory cell.

U.S. Pat. No. 6,919,592, entitled "Electromechanical Memory Array Using Nanotube Ribbons and Method for Making Same" discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Pat. No. 6,919,592, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state.

The deflected, physical state has non-volatile properties, meaning the ribbon retains its electrical (and therefore informational) state even if power to the memory cell is removed. As disclosed in U.S. Pat. No. 6,911,682, entitled "Electromechanical Three-Trace Junction Devices," three-trace architectures may be used for electromechanical memory cells, in which the two of the traces are electrodes to control the deflection of the ribbon.

The use of an electromechanical bi-stable device for digital information storage has also been suggested (See U.S. Pat. No. 4,979,149, entitled "Non-volatile Memory Device Including a Micro-Mechanical Storage Element").

The creation and operation of bi-stable, nano-electro-mechanical switches based on carbon nanotubes (including mono-layers constructed thereof) and metal electrodes has been detailed in earlier patent applications having a common assignee as the present application, U.S. Pat. Nos. 6,784,028, 6,835,591, 6,574,130, 6,643,165, 6,706,402, 6,919,592, 6,911,682, and 6,924,538; U.S. Patent Publication Nos. 2005/0062035, 2005/0035367, 2005/0036365, 2005/0128788, 2004/0181630, and 2004/0175856; and U.S. patent application Ser. Nos. 10/341,005, 10/341,055, 10/341,054, 10/341,130, 10/864,186, 11/835,583, 11/835,651, and 11/835,613 the contents of which are all hereby incorporated by reference in their entireties (hereinafter the "incorporated patent references").

SUMMARY OF THE INVENTION

The present invention provides structures and methods of making two-terminal nanotube switching elements, and more specifically switching elements including carbon nanotubes formed across a gap between two electrodes or between an electrode and an interconnect line.

The present invention also provides arrays of memory structures and arrays of memory cells based on these two-terminal nanotube switches having nanotube bridges.

Under one embodiment of the invention, a two-terminal switching device, is provided. The device includes a first conductive terminal extending up from a substrate and a second conductive terminal extending up from the substrate, the second conductive terminal in spaced relation to the first terminal, so that the spaced relation defines a void in the substrate. The device further includes a nanotube article having at least one nanotube, the article being arranged to permanently contact at least a portion of the first and second terminals and partially suspended over the void. The device further includes a stimulus circuit in electrical communication with at least one of the first and second terminals. The stimulus circuit generates and applies selected waveforms to at least one of the first and second terminals to induce a change in the resistance of the device between the first and second terminals between a relatively low resistance and a relatively high resistance, so that the relatively high resistance between the first and second terminals corresponds to a first state of the device, and so that the relatively low resistance between the first and second terminals corresponds to a second state of the device.

In one aspect of the invention, the void is bounded on a first side by the first conductive terminal and on a second side by the second conductive terminal.

In another aspect of the invention, the void is bounded on a first side by one of the first and second conductive terminals and on a second side by a sidewall of substrate material.

In another aspect of the invention, the void is bounded on a first side by a first sidewall of substrate material and on a second side by a second sidewall of substrate material, the first sidewall of substrate material forming a thin insulating layer over the first conductive terminal and the second sidewall of substrate material forming a thin insulating layer of the second conductive terminal.

In another aspect of the invention, the first and second conductive terminals include at least one of Al, Cu, W, Co, Ti, Ta, TiW, $CoSi_x$, $WSi_2$, $TiSi_x$, TaN, TiN, TiAlN, Au, Ag, Ru, and RuO.

In another aspect of the invention, a dielectric material is disposed over the nanotube article, substantially sealing the void.

In another aspect of the invention, the dielectric material includes at least one of $Si_3N_4$, $SiO_2$, Tetraethyl orthosilicate, Phosphosilicate glass, $Al_2O_3$, $HfO_2$, $ZrO_2$, SiCN, and SiON.

In another aspect of the invention, the nanotube article includes a patterned region of nanotube fabric.

In another aspect of the invention, when the device is in the relatively low resistance state, the nanotube fabric provides a plurality of electrically conductive pathways between the first and second conductive terminals.

In another aspect of the invention, the nanotube fabric includes a multilayered fabric.

In another aspect of the invention, the nanotube fabric includes a substantially monolayer of unaligned nanotubes.

In another aspect of the invention, the nanotube article includes an active region suspended over the void and the relatively high and relatively low resistances between the first and second terminals correspond to relatively high and relatively low resistance values of the active region.

In another aspect of the invention, the stimulus circuit further includes a circuit for reading the first and second states of the device without substantially altering the relatively high and relatively low resistance between the first and second terminals.

In another aspect of the invention, the first and second states of the device are nonvolatile.

In another aspect of the invention, the nanotube article completely overlaps an upper surface of at least one of the first and second terminals.

In another aspect of the invention, the at least one nanotube is substantially encapsulated in a metal material, the at least one nanotube having a cross-sectional dimension that substantially deforms in one of the first and second states of the device.

Under another embodiment of the invention, a nanotube switching device includes a conductive terminal extending up from a substrate, the conductive terminal defining a first boundary of a void and a vertical wall of substrate material defining a second boundary of a void. The device further includes an interconnect line disposed in the void, providing an electrical communication pathway to and from external circuitry, and a nanotube article having an unaligned network of nanotubes, the article being arranged to permanently contact at least a portion of each of the conductive terminal and the interconnect line, and suspended over the void. The device further includes a stimulus circuit in electrical communication with conductive terminals. The stimulus circuit generates and applies waveforms to the conductive terminal to induce a change in the resistance of the nanotube article between a relatively low resistance and a relatively high resistance, so that the relatively high resistance corresponds to a first state of the device, and so that the relatively low resistance corresponds to a second state of the device.

In another aspect of the invention, the at least one of the conductive terminal and the interconnect line include one or more of the following materials: Al, Cu, W, Co, Ti, Ta, TiW, $CoSi_x$, $WSi_2$, $TiSi_x$, TaN, TiN, TiAlN, Au, Ag, Ru, and RuO.

In another aspect of the invention, a dielectric material is disposed over the nanotube article, substantially sealing the void in the substrate.

In another aspect of the invention, the network of unaligned nanotubes provides one or more electrically conductive pathways between the conductive terminal and the interconnect line, the electrically conductive pathways forming and unforming in response to the waveforms.

In another aspect of the invention, the network of unaligned nanotubes providing the electrically conductive pathways between the conductive terminal and the interconnect line includes an active region of the nanotube article.

In another aspect of the invention, the electrical stimulus on the interconnect line does not substantially alter the relatively high and relatively low resistance of the nanotube article.

Under another embodiment of the invention, a method of fabricating a nantoube switching device is provided. The method includes embedding at least one electrode in a substrate and forming a patterned region of nanotube fabric, the patterned region of nanotube fabric being arranged to permanently contact at least a portion of the electrode. It further includes removing a selected portion of the substrate, adjacent to the at least one electrode, to define a void in the substrate bounded in part by the electrode, such that the patterned region of nanotube fabric forms another boundary of the void in the substrate and providing a stimulus circuit in electrical communication with the at least one electrode. The stimulus circuit generated and applies one or more waveforms to the at least one electrode to induce a change in the resistance of the patterned region of nanotube fabric between a relatively low resistance and a relatively high resistance, so that the relatively high resistance corresponds to a first state of the device, and so that the relatively low resistance corresponds to a second state of the device.

In another aspect of the invention, a substrate material overlying the nanotube fabric may be provided, and defining a void includes removing substrate material overlaying the patterned region of nanotube fabric, subsequent to forming the patterned region of nanotube fabric.

In another aspect of the invention, embedding at least one electrode in the substrate includes substantially sealing the void in the substrate.

In another aspect of the invention, forming the patterned region of nanotube fabric includes suspending the patterned region of nanotube fabric over the void.

In another aspect of the invention, a dielectric layer may be disposed over the patterned region of nanotube fabric, such that the dielectric layer substantially seals the void in the substrate.

In another aspect of the invention, the nanotube fabric is substantially porous.

In another aspect of the invention, embedding at least one electrode in a substrate includes planarizing an upper surface of the substrate and the at least one electrode.

In another aspect of the invention, removing a defined portion of the substrate includes an etching step selected to substantially preserve the at least one electrode.

In another aspect of the invention, forming the patterned region of nanotube fabric includes one of a spin coating and a spray coating step.

In another aspect of the invention, each of the spin coating and spray coating steps includes applying nanotubes having a length substantially longer than a lateral dimension of the void.

In another aspect of the invention, forming a patterned region of nanotube fabric includes filling the void with a sacrificial material, forming a nanotube fabric over the sacrificial material and the at least one electrode, patterning and etching the nanotube fabric to form the patterned region, and removing the sacrificial material to suspend the patterned region of nanotube fabric over the void.

In another aspect of the invention, the at least one electrode includes a first and second electrode.

In another aspect of the invention, an interconnect line may be disposed in the void, providing an electrical communication pathway to and from external circuitry.

BRIEF DESCRIPTION OF THE DRAWINGS

FIG. 1A is a top view of electrodes formed within a dielectric, according to some embodiments.

FIG. 1B is a cross-section view of the structure of FIG. 1A having electrodes formed within a dielectric, according to some embodiments.

FIG. 3A is a top view of a structure with a carbon nanotube layer overlaying metal filled plugs but not filling the trench, thereby forming a bridge between electrodes, according to some embodiments.

FIG. 3B is a cross-section view of a structure with a carbon nanotube layer &timing a bridge between electrodes, according to some embodiments, according to some embodiments.

FIGS. 4A-B illustrate a structure when a carbon nanotube layer is fully enclosed within the boundaries of the previously formed trenches and spans electrodes, according to some embodiments.

FIGS. 5A-B illustrate a structure when a carbon nanotube layer has been patterned and a passivating dielectric is deposited, according to some embodiments.

FIGS. 6A-B illustrate a structure when a trench fully occupies the region between electrodes and a carbon nanotube layer fully spans the trench region and completely overlaps the edges of both electrodes, according to some embodiments.

FIGS. 7A-B illustrate a structure when a trench fully occupies the region between electrodes and a carbon nanotube layer fully spans the trench region, overlaps the edge of the electrodes in one direction, and underlaps the edge of the electrodes in the other direction, according to some embodiments.

FIGS. 8A-B illustrate a structure when a trench does not fully occupy the region between electrodes and a carbon nanotube layer fully spans the trench region, overlaps the edge of the electrodes in one direction, and underlaps the edge of the electrodes in the other direction, according to some embodiments.

FIGS. 9A-B illustrate a structure when a trench is placed such that the carbon nanotube includes a section between the electrodes that are over the trench, and a section that is not over the trench between the electrodes, according to some embodiments.

FIGS. 10A-B illustrate a structure with one elongated electrode, according to some embodiments.

FIGS. 11A-B illustrate a single electrode formed in a dielectric, according to some embodiments.

FIGS. 14A-B illustrate a structure when metal deposition fills interconnect trenches, according to some embodiments.

FIGS. 15A-B illustrate a resulting structure after planarization of metal and trench dielectric is performed, according to some embodiments.

FIGS. 16A-B illustrate a recess mask through which a trench dielectric that separates the electrode and the metal filled interconnect trench is selectively removed, according to some embodiments.

FIGS. 17A-B illustrate a carbon nanotube layer applied over a structure after a trench dielectric is selectively removed, according to some embodiments.

FIGS. 20A-B illustrate a structure when an alternative processing technique is used and a dielectric is selectively removed to form a trench after a carbon nanotube layer has been applied, according to some embodiments.

FIG. 21A-B illustrate a final structure after a passivation dielectric has been deposited, according to some embodiments.

FIGS. 23A-C illustrate a structure in which two metal deposition steps are used to completely encapsulate a nanobridge structure, according to some embodiments.

FIGS. 24A-B illustrate top and cross sectional views of a nanobridge 2-Terminal NRAM device with metal-CNT fabric-metal contacts, according to some embodiments.

DETAILED DESCRIPTION

Figure 2:
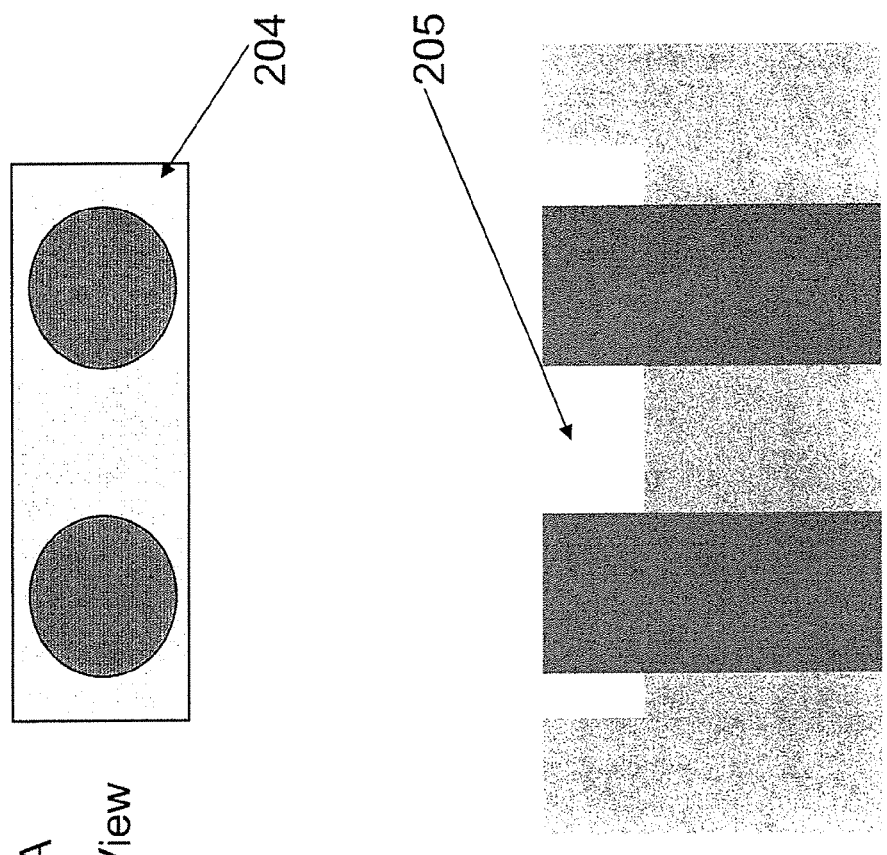
FIG. 2A is a top view of a structure when a trench mask pattern is provided over the dielectric, according to some embodiments.
FIG. 2B is a cross-section view of a structure when trenches are formed in the dielectric, according to some embodiments.

Inventors have found that by creating a two-terminal nanotube switch with a nanotube switching element suspended over a void region, effective switching of reprogrammable memory cells may be achieved. Certain advantages to this structure have been identified. The inventors have found that alternative fabrication methods to those described in related applications that may have cost and performance benefits, especially with respect to yield.

The present application is directed to various structures and fabrication methods for making two-terminal nanotube switching devices with one or more suspended regions of nanotube fabric. Inventors have found that the performance and fabrication advantages of two-terminal nanotube switching devices—and specifically those with suspended regions of nanotube fabric—are derived from a variety of sources. Specifically, in certain embodiments, it is desirable to have two-terminal nanotube switching structures in which the carbon nanotube portion of the structure creates a bridge over a gap formed between conductive contacts. In certain applications, the fabrication process is simplified when it is not necessary to create a carbon nanotube switching element that is positioned in direct contact with an underlying substrate and/or overlying material disposed between the conductive contacts. Without wishing to be bound by theory, the inventors believe that one challenge in the fabrication of carbon nanotube circuit elements may be the creation of space in which at least some carbon nanotubes can electromechanically move. Thus, in certain applications, it is advantageous to form a bridge over a gap in the substrate between conductive contacts—a "nanobridge." In accordance with at least one current theory of operation, inventors believe that forming a bridge over a void, instead of fixing the nanotubes to surrounding materials in all planes, may facilitate movement of the nanotubes. At present, a variety of theories of operation are being considered by the inventors and thus the evident usefulness of nanobridges may be attributable to one or more different switching mechanisms.

The present application relates closely to U.S. patent application Ser. No. 11/280,786, entitled Two-Terminal Nanotube Devices and Systems and Methods of Making Same. Application Ser. No. 11/280,786 which discloses two-terminal nanotube switching devices. U.S. patent application Ser. No. 11/280,786 discloses switching elements that may be used to make nonvolatile and other memory circuits. The application also provides structures and methods of making two-terminal nanotube switches, arrays of memory cells based on these switches, fuse/antifuse devices based on these switches and reprogrammable wiring based on these switches. Embodiments of the devices disclosed in application Ser. No. 11/280,786 include memory circuit elements with carbon nanotubes deposited over and between conductive contacts (e.g., electrodes), such that the carbon nanotubes are capable of forming and unforming an electrical pathway between the contacts. In yet other embodiments, the carbon nanotubes are positioned in direct contact with an underlying substrate and/or overlying material that is disposed between the conductive contacts. The present application provides nanotube switches similar to those disclosed in U.S. patent application Ser. No. 11/280,786, but specifically features nanobridges.

2-Terminal Carbon Nanotube Switches

NRAM circuit elements, and more particularly two-terminal nonvolatile carbon nanotube (CNT) memory devices, can be fabricated in a variety of ways. In the present structures, CNTs are provided in communication with one or more conductive contacts. These contacts provide the signals used to set (program) and read the state of the circuit element. Switching behavior may be controlled by a variety of parameters including materials, switching environments and electrical stimulus characteristics, etc. Specifically, inventors have found that the separation (or lack thereof) between the CNTs and adjacent substrates contributes, measurably, to switching behavior.

Various methods of fabricating CNT NRAM circuit elements are described in more detail in U.S. patent application Ser. No. 11/280,786, the entire contents of which are incorporated herein by reference. U.S. patent application Ser. No. 11/280,786 discloses methods of fabrication where a polymer is formed over the top of the CNT fabric. By using a polymer, overlying CNT fabric, switching behavior may be adjusted. According to one theory of operation, the switching behavior depends partially on and is facilitated by cavities formed in the CNT fabric. Without wishing to be bound by theory, inventors believe in the fabrication of CNT circuit elements, one relevant parameter may be whether there are nano-scale spaces in which the CNT circuit elements can physically move. Inventors maintain that other mechanisms by which the circuit element switches between states are possible and relevant (e.g., alterations in heat flow). Like the above-mentioned application, the present disclosure provides two-terminal nanotube switches, and various devices using those switches.

Finding suitable polymers that are both compatible with the CNT material and easily integrated into IC fabrication flows can be challenging. It is therefore desirable, according to an abovementioned theory of operation, to create a region in which the CNTs may switch without requiring the use of specialized polymers or other complicated processing. Current integration schemes may use polymers such as polyimides that are placed directly over and in contact with the CNT layer. The inventors believe the initial switching of the CNT memory element may form nano-cavities by way of associated localized heating generated during the initial "erase" stage. These nano-cavities may provide a region in which the CNT strands may move into and out of contact with one another, thereby forming and unforming electrically conductive channels. According to one theory, the switching events include localized heating, so a reaction between the carbon and the polymer layer may cause oxidation or other deleterious effects to the carbon nanotube strands in the nano-cavity. Thus, the inventors propose the use of a structural "void" region that does not require a polymer may eliminate any undesirable effects that may arise from an interaction between the polymers and the CNTs during switching events. While the above description refers to a present theory of operation, inventors acknowledge that other theories are plausible and possible.

2-Terminal "Nanobridge" Switches

The present disclosure provides methods of fabricating such a region in which CNTs may switch. A "void" region is formed in a substrate over which the CNT material is placed. The structure provides an open region where the CNTs may move between an ON and OFF state, thereby creating a "nanobridge" switch. In general, a nanotube element or article overlaps at least a portion of each of two terminals, e.g., conductive elements. A stimulus circuit, connected to one or both of the terminals, applies appropriate electrical stimulus to which the nanotube element responds by changing the state of the switch. For example, the resistance of an electrical pathway between the two terminals characterizes the state of the switch. A relatively high resistance pathway corresponds to an "open" or OFF state of the switch, and a relatively low resistance pathway corresponds to a "closed" or ON state of the switch. The two states are non-volatile. The stimulus circuit can non-destructively read-out (NDRO) the state of the switch, and can change the state (e.g., resistance) of the switch repeatedly. The present disclosure includes various embodiments of the nanobridge switch wherein different methods are used to form a void and overlying CNT capable of switching states.

Without wishing to be bound by theory, the inventors believe that the ability to change the switch between the two abovementioned states is related to a relationship between the thermal and electrical characteristics of the switch. A more detailed description of some mechanisms by which switching may occur is provided in U.S. patent application Ser. No. 11/280,786, entitled, "Two Terminal Nanotube Devices and Systems and Methods of Making Same."

The switch can be fabricated using methods that are easily integrated into existing semiconductor fabrication methods. Several methods that allow the fabrication of a nanotube bridge of specified geometry between the nanotube article or element and underlying void are described in detail.

Because the switch can be controllably switched between two non-volatile states, and because the fabrication of the switch can be integrated into existing semiconductor fabrication methods, the switch is useful in a number of applications. For example, the switch can be implemented in non-volatile random access memory (NRAM) arrays, reprogrammable fuse/antifuse devices, and in reprogrammable wiring applications.

In the following discussion, methods of fabrication of nanobridge switches are described. In some embodiments a dielectric substrate is provided with one or more conductive contacts (e.g., electrodes) positioned in the dielectric medium. Then, in such embodiments, a trench mask pattern is provided over the dielectric and trenches are formed using techniques widely known in the art. Subsequently, a carbon nanotube layer overlaying the conductive contacts (e.g., electrodes) but not filling the trench is provided and thereby forms a bridge over a trench. In certain embodiments, after the CNT layer has been patterned, a passivating dielectric is then deposited, overlaying the aforementioned structure. The various embodiments include different dimensions of the structural elements, different orientations, and the application of different masks for fabrication steps.

Methods of Fabrication

FIG. 1 illustrates a first step in the fabrication of a first embodiment of the nanobridge switch. FIG. 1 A is the top view of electrodes 101, 102, formed within a dielectric 102. FIG. 1 B is the cross-section view of the pattern shown in FIG. 1 A and electrodes 101, 102 formed within a dielectric 103. In some embodiments, lower electrodes are formed within a dielectric using conventional means. For a non-limiting example, contacts may be etched into a dielectric down to underlying circuits or interconnects with a Reactive Ion Etch (RIE) process. The contact openings are then filled with metal and subsequently planarized. Electrodes may be composed of Al, Cu, W, Al(<1% Cu), Co, Ti, Ta, TiW, CoSi$_x$, WSi$_2$, TiSi$_x$, TaN, TiN, TiAlN or other suitable metals. The resulting structure provides a substrate in which a void may be subsequently fanned. Other methods may also be employed to make lower electrodes, such as, depositing a metal or metal stack, then etching the metal or metal stack with an RIE process, creating metal interconnect lines. The area between the interconnect lines is then filled with a dielectric such as, but not limited to, silicon dioxide. The silicon dioxide may be deposited in such a manner that the metal interconnects are fully embedded within the dielectric. A planarization process can then be performed that is selective to the metal or metal stack—i.e., the planarization process stops once the top of the metal or metal stack is reached.

Methods for providing contacts follow well-known techniques and are described in patent publications and issued patents listed herein and commonly assigned to the assignee of the resent application, or are currently used in present-day electronic industry practices.

FIG. 2 illustrates a subsequent stage in the fabrication of the nanobridge switch, in which a trench mask 204 is created. FIG. 2 A is the top view of the structure when a trench mask 204 pattern is provided over the dielectric. FIG. 2 B is the cross-section view of the structure when trenches 205 are formed in the dielectric 103. In this case, the trench mask is open and underlying dielectric is removed in areas without overlying photoresist. It is preferable to use an anisotropic etch to form substantially vertical walls, although slight angles to vertical would be acceptable as well. The etch of the dielectric should be selective to the metal within the plugs such that very little of the metal is removed during the etch. Selectivities of at least 5:1 are acceptable with at least 20:1 being preferred. As an example, if bottom electrodes are constructed from Al, which forms non-volatile compounds in chlorine chemistries, then fluorine gas chemistries can be used so that the dielectric layer is etched. However, the Al metal interconnect/via is not etched. Other metal/dielectric etch schemes can be developed depending on the materials employed in the systems.

Note that the positioning of the trench mask pattern with respect to the previously formed vias is flexible. The positioning shown in FIG. 2 is used for illustrative purposes and should not be considered restrictive. A sacrificial material may also be used at this stage to facilitate the deposition of additional materials on top of the suspended CNT fabric layer, as described below.

Sacrificial materials may also be deposited within the trench structure to prevent conformal coating of the sidewalls with nanotubes. Example sacrificial materials are any materials that can readily be removed from the trench during the last stages of processing without affecting the dielectric substrate, CNTs, metal electrodes, etc. As an example, where the substrate is silicon dioxide and the electrodes are W, aluminum can be deposited and planarized selectively within the trench—i.e., neither the silicon dioxide or W are removed or contain any considerable amount of dishing. After the final structure is completed, the Al may then be removed with a wet etch process, such as room temperature anisotropic etches of silicon using tetramethylammonium hydroxide (TMAH).

The use of sacrificial materials in the fabrication process is well-known in the art and detailed, in particular, in U.S. patent application Ser. No. 6,835,591, the contents of which are herein incorporated by reference.

The sacrificial layers can be constructed of $Al_2O_3$, metal oxides, salts, metals and other materials. Intermediate structures can be formed using a variety of materials to form supports including SOG, $SiO_2$ and others. In the event that a low temperature spin-coating of nanotube protocol is chosen, the selection of materials suitable to be sacrificial layers expands substantially. Suitable materials include, depending upon the specific application, materials such as PMMA or other polymers, metals such tungsten, chromium, aluminum, bismuth and other transition and main group metals. In addition, other semiconductors such as germanium and insulators such as salts, oxides and chalcogenides may be suitable.

The materials selection process is confined to those materials that are compatible with the fabrication process described. It is understood by those sufficiently skilled in the art that upon selection of a particular electrode material, the sacrificial layer and support materials naturally become limited based upon typical processing steps available in semiconductor fabrication. Likewise, if a particular sacrificial layer is chosen, the choices of electrode and support materials is suitably limited. Furthermore, upon selection of a particular support material it follows that the electrode and sacrificial layer materials choice is likewise limited.

FIG. 3 illustrates a subsequent stage in fabrication in which a carbon nanotube layer 306 is applied and the sacrificial material is removed. FIG. 3 A is the top view of the structure with a carbon nanotube layer 306 overlaying electrodes but not filling the trench, thereby forming a bridge between the electrodes. FIG. 3 B is the cross-section view of the structure with a carbon nanotube layer 306 forming a bridge between the electrodes.

A CNT layer is applied such that the CNTs overlay the metal filled plugs (contacts) but do not fill the trenches, thereby forming a "bridge" between the contacts. CNT material may be applied in a number of methods to provide this effect. For example, the application process may be a "spin-on" method whereby the CNTs are suspended in solution and applied to the wafers using conventional spin-on tracks typically used for applying photoresist. This application method allows for the formation of a bridge, with CNT material spanning, instead of filling the trenches. The lengths of the CNTs in the solution are carefully controlled and tend to be significantly longer than the trench width over which they span. Because the rigidity of the CNTs is such that they tend to remain straight, most CNTs will prefer to overlay the trench and will not conformally fill it. Though a few CNTs within solution may fall into the trenches, these would not cause electrical problems, nor would they be expected to negate the advantage of the trench void. In some embodiments, the space between the metal electrodes will also be narrow enough so that the nanotubes do not deposit conformally to the trench. As an example, an aspect ratio of 5:1 between trench height and electrode spacing may be desirable.

Alternatively the CNTs may be "sprayed" onto the wafers using tooling optimized for the application method. Similarly to the spin-coating method, using appropriate device dimensions will ensure that the CNTs sufficiently span the spacing between the electrodes. In order to ensure that at least some, if not most of the CNTs bridge the gaps, it important that the CNTs have lengths substantially longer than the width of the trench over which they will span. Methods for controllably growing CNTs of selected dimensions are well known in the art and are described in greater detail in U.S. patent application Ser. No. 10/341,055, the contents of which are herein incorporated by reference, in their entirety.

FIG. 4 illustrates the structure when the switching region of the carbon nanotube layer is, on three sides, enclosed within the boundaries of the previously formed trenches 205, whose boundaries are determined by trench mask 204, and spans the electrodes. The CNTs are patterned 407 using conventional photolithographic methods and etched using methods known in the art and described extensively in U.S. Pat. No. 6,835,591, the entire contents of which are incorporated herein by reference.

Various techniques may be used to pattern the CNT layer, and are not limited to those described. Under certain embodiments, the non-woven fabric layer of CNTs is grown over the structure through the use of a catalyst and through the control of a growth environment. Some embodiments may provide a matted nanotube layer separately and apply it directly over the structure. While a structure under this approach preferably includes a sacrificial layer to provide a planar surface to receive the independently grown fabric, a sacrificial layer may not be necessary. Once a matted nanotube layer is provided over the surface of the structure, the layer is patterned and etched to define a pattern of nanotube fabric that lies in a defined region. The sacrificial layer is then removed (e.g., with acid) forming the desired pattern as described above. Because the matted layer of nanotubes form a non-woven fabric that is not a contiguous film, etchants or other chemicals may diffuse between the individual nanotube "fibers" and more easily reach the underlying components, such as the sacrificial layer.

The CNT pattern may be fully enclosed within the boundaries of the previously formed trenches in the area where switching is desired, and specifically between the two previously formed electrodes. While fully enclosing the CNT pattern within the boundaries of the previously formed trenches in the area of switching may be preferred for some applications, it is not required. The length (L) and width (W) of the patterned CNT Circuit Element are shown. The width of the CNT pattern is determined by the span of conductive contacts in a first direction, and the length refers to the switching region spacing in a second direction. In some embodiments, the switching region spacing is the conductive contacts spacing.

FIG. 4 also illustrates that the extent of the CNT mask with respect to the electrodes and the trench mask 204 is not critical except that the CNT pattern 407 after etching must make contact to the conductive contacts. After all process variations including CD, misalignment and etch biases, the CNTs should ultimately have enough contact area with the electrodes to provide a low enough contact resistance for the purposes of the associated circuit and application. At present, inventors believe that extending the CNT pattern 407 past the ends of the trenches 205 outside of the switching region has no noteworthy impact on the performance of the switch.

Figures 5, 5A:
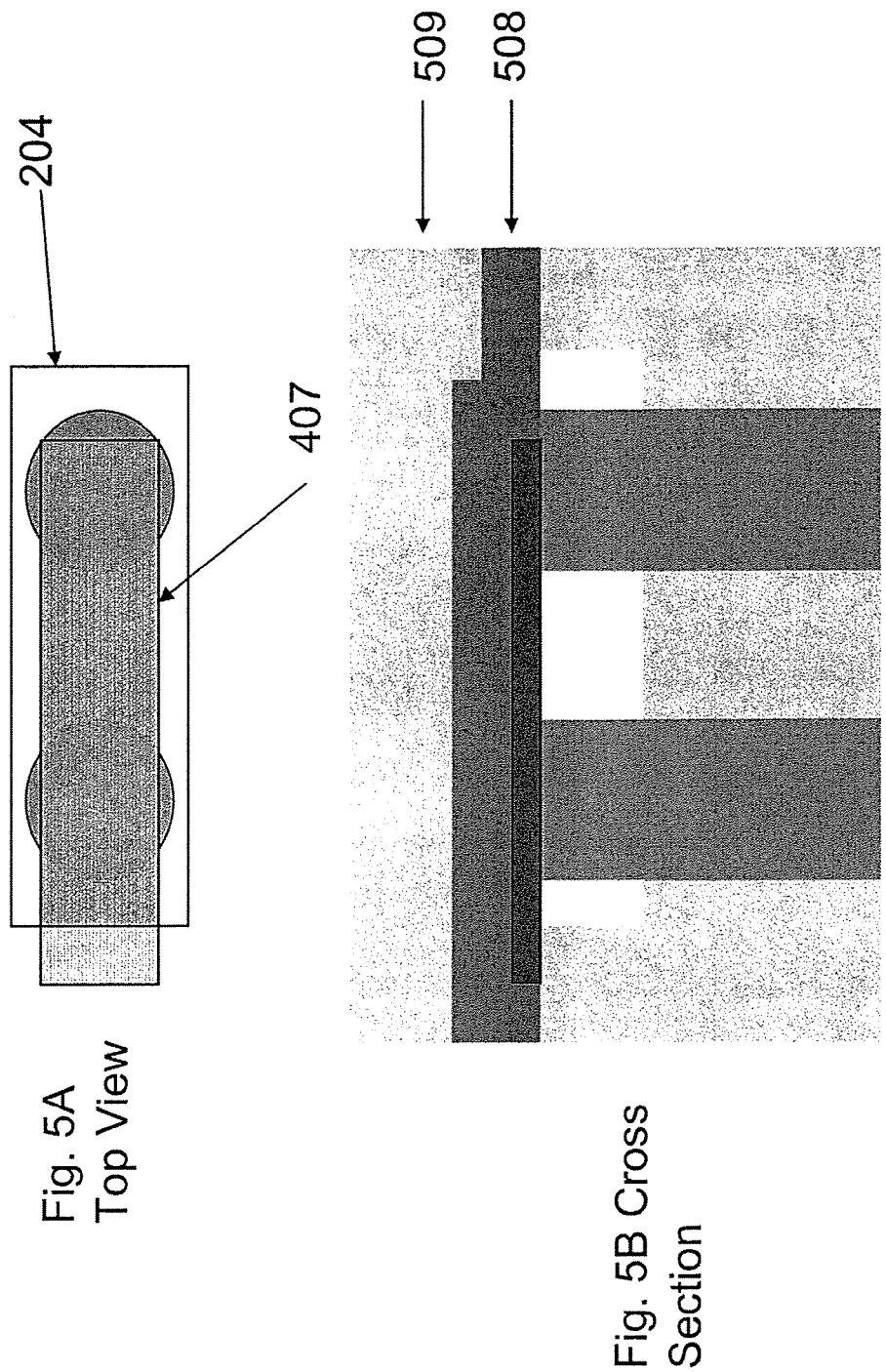

FIG. 5 illustrates the structure after the CNT has been patterned 407, which is sealed by a primary passivating layer 1 or dielectric 508. Also a second passivating layer 509 may be deposited which can be used to seal the primary passivating layer 1. The dielectric for passivating layer 1 may be any number of materials such as SiN, $Si_3N_4$, $SiO_2$, TEOS, PSG, $Al_2O_3$, $HfO_2$, $ZrO_2$, SiCN, SiON, or any combination thereof including various polymers. Other dielectrics are anticipated as well and can be used for layer 508 or 509 as needed. This dielectric provides a hermetic seal over the CNT Circuit Element. In some embodiments, multilayered fabrics or low porosity fabrics are used so as to avoid filling the trenches during the deposition of passivating layers. In some embodiments, the dielectric deposits substantially primarily on horizontal features on the surface of the wafer. Physical Vapor Deposition (PVD) is one such method that provides this deposition characteristic. Therefore, some methods to deposit passivating layer 1 include using PVD and PECVD, where persons skilled in the art would design the deposition conditions as appropriate. The deposition of a dielectric ensures that the upper surface of the CNT element is substantially covered and passivated, while the lower surface spanning the void/trench is left exposed. Sufficient dielectric thickness should be deposited to substantially seal off the void from exposure to future processing steps. This will substantially prevent exposure of the bottom of the CNT Circuit Element, and protect it from being affected by later processing.

In some embodiments, thick multilayered CNT fabrics are used. Multilayered CNT fabrics may be easier to suspend, without the use of a sacrificial material because of the combined effect of the van der Waals interactions within a multilayered fabric that limits the number of dangling nanotubes. Further, their use may facilitate the deposition of a passivation layer that will not damage the active switching region, as any damage may be contained in the upper regions of the fabric. In certain applications, the multilayered fabric is comparatively nonporous, such that "void filling" is minimized. The use of thick, multilayered CNT fabrics in switching devices is detailed in U.S. Patent Appl. No. 60/855,109, the contents of which are herein incorporated by reference.

In certain embodiments of the present invention, monolayered nanotube fabrics, particularly those with minimum porosity, may be preferred. Techniques employing single layered nanotube fabrics in switching devices and other nanotube circuit elements are known in the art and detailed in the incorporated references.

Following the deposition of the passivating dielectric 509, conventional processing may resume. For example, Back End of the Line Inter-Layer Dielectric (BEOL ILD) dielectrics may be deposited and planarized, metal lines and vias may be fanned, etc. Alternately, Back End of the Line Inter-Metallic Dielectric (BEOL IMD) materials may be used.

FIGS. 6-10 show various exemplary configurations of the electrodes, trench, and CNT patterns, according to certain embodiments.

In the various configurations that follow, the nanobridge switch has a pathway between conductive contacts that can be in one of two states. One state is characterized by a pathway that has a relatively high resistance between the conductive contacts. Current generally flows poorly between conductive elements in this "open" or OFF state. The other state is characterized by a pathway that has a relatively low resistance between conductive contacts. Current generally flows easily between conductive contacts in this "closed" or ON state.

In some embodiments, a nanobridge switch is fabricated in the low-resistance or "closed" state. The resistance of this state depends on the characteristics of nanotube element and of conductive contacts. The inherent resistance of the nanotube element, and nanofabrics in general, can be controlled as described in U.S. patent application Ser. No. 11/280,786. The total resistance of a nanobridge switch between conductive contacts in the "closed" state includes the contact resistance of each overlap region in series, plus the inherent series resistance of the nanotube, divided by the number of nanotube pathways (which may be single nanotubes and/or networks of nanotubes) between contacts.

FIG. 6 illustrates the structure when the trench fully occupies the region between the conductive contacts and the carbon nanotube layer fully spans the trench region and completely overlaps the edges of both conductive contacts. The trench is shown to completely cover the span between the conductive contacts with enough overlap of the CNT mask to ensure that the full width of the CNT bridge is over the trench region between the vias. That is, the CNT mask 407 is longer than the length of the trench mask 204, the spacing between the edges of the electrodes, but is narrower than the width of the trench mask 204. In this figure, the CNT pattern fully overlaps the edges of both conductive contacts, lengthwise, thereby providing a lower resistance pathway between the CNT layer and the electrode. As in FIG. 5, the dielectric layer lies over the CNT layer.

FIG. 7 illustrates the structure when the trench does not fully occupy the region between the electrodes and the carbon nanotube layer fully spans the trench region. The structure illustrated in FIG. 7 has one edge of the trench mask 204 under-lapping the conductive contact thereby providing a small region between the contacts where the CNT 407 is not overlying an open trench.

In the layout of FIG. 7, the region of CNT that is not overlying the trench will still conduct signals to the switching region (CNTs over the trench void). Consequently, switching may still be performed. The result of this arrangement of trench and contacts is that the trench region is narrower than that in alternate embodiments. The narrower trench region may provide advantages in some applications. It may be desirable to position electrodes closer to one another, for example, by use of an offset, although variation in electrode spacing is limited by the ability of the lithography techniques to resolve that space. Specifically, for layouts where it is not possible to place one of the contacts close to the other, this arrangement would still provide a narrow trench without requiring a narrow contact spacing. It is also possible to provide a CNT Switch length "L" that is smaller than would be possible with conventional lithography since the "L" is defined as the overlapping of the trench mask with contacts as shown in FIG. 7.

FIG. 8 illustrates the structure when the trench does not fully occupy the region between the conductive contacts and the carbon nanotube layer 407 fully spans the trench region, overlaps the edge of the contacts in the length dimension, and underlaps the edge of the contacts in the width dimension. FIG. 8 illustrates another variation of FIGS. 6 and 7 in that neither edge of the trench mask 204 is self-aligned to the contacts (i.e., does not overlap the contacts). This provides flexibility in where the switching element is placed relative to the electrodes. While the abovementioned variation may cause higher resistance in the conductive pathway due to longer separation from electrode to electrode, in certain applications it may be permissible or even preferable to have a higher resistance pathway (e.g., for a reset-able fuse). From FIGS. 6-8, it should be obvious to one skilled in the art that the location of the trench region with respect to the electrodes is not critical for enabling switching. Alternate embodiments are possible.

FIG. 9 illustrates the structure when the trench is placed such that the carbon nanotube fabric consists of a section between the electrodes that are over the trench, and a section that is between the electrodes but not over the trench. FIG. 9 shows yet another arrangement of the trench, CNT, and contacts in which the CNT pattern between the contacts extends over both trench and non-trench regions across the entire span. This arrangement is advantageous in a situation where a very narrow CNT Switch Width ("W" in the figure) is desired.

FIG. 10 illustrates an embodiment in which an alternative conductive contact geometry is used. An elongated or "slotted" contact 1011 and a conventional contact 101 are paired in the same structure. As stated above, in various applications the conductive contacts are electrodes. Embodiments with an elongated or "slotted" electrode may be useful in high density applications where many CNT Circuit Elements are arranged in an array with one electrode of each switch being tied to a common node in the circuit. Though only one element is shown, it should be obvious that multiple elements may be arranged with similar orientation to provide a high density memory array. Other arrangements are envisioned including those with a single via coming from above or below, or a single connection, on a first side, to only that respective CNT ribbon or two elongated electrodes either above or below.

In the above embodiments, two lower electrodes are formed. In between the two electrodes, the CNT Circuit Element is fabricated. In this particular arrangement, the Silicon area required by the switch is partially determined by the minimum electrode spacing. This spacing may be greater than that required by the CNT Circuit Element. In order to provide a smaller switch, the following embodiment is suggested.

Structures Having Single Electrode

The "Single Electrode Embodiment" can be formed using a method by which a sub-lithographic-minimum dimension can be formed to provide a CNT switch Length below that typically possible with standard lithography. An exemplary method uses a self-aligned process to provide the second electrode at a very controllable spacing from the first "single" electrode. The fabrication process is alternative to the abovementioned two-terminal embodiments, but similarly produces a two-terminal device.

The following embodiment includes a method of forming a single conductive contact (e.g., electrode) in a dielectric substrate. It may be preferred in applications in which a smaller switch is desired. Steps of fabrication are described below.

Figures 12, 12A, 12B:
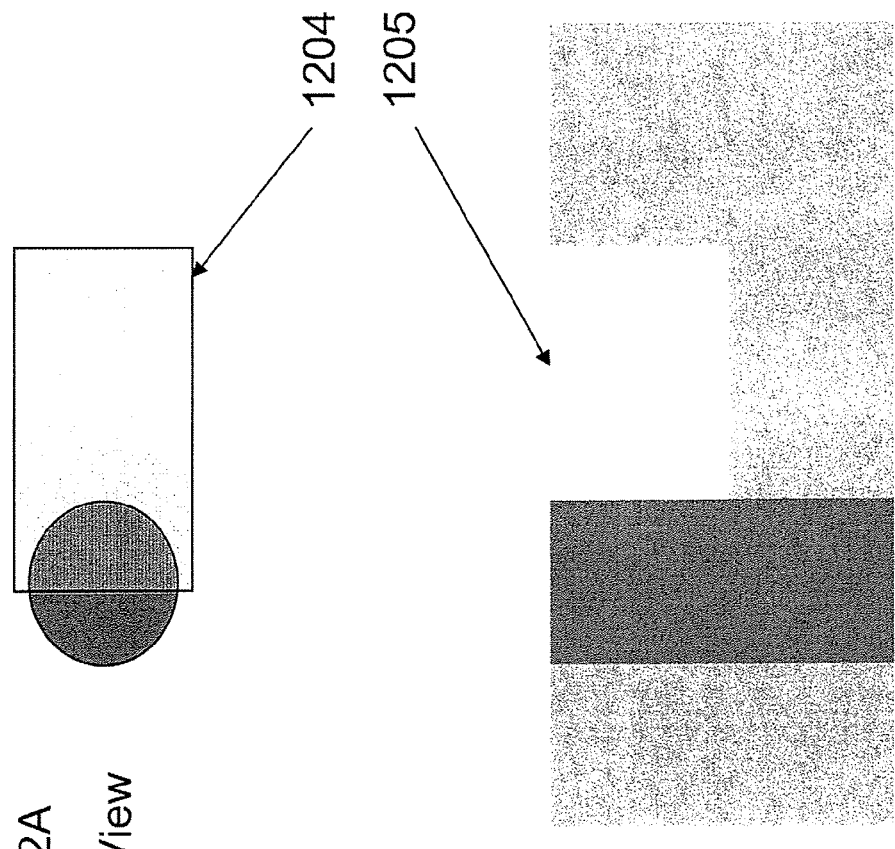
FIG. 12A is a top view of a structure when a trench mask is formed over a single electrode, according to some embodiments.
FIG. 12 B is a cross-section view of a structure when an interconnect trench is formed, according to some embodiments.
Figures 13, 13A, 13B:
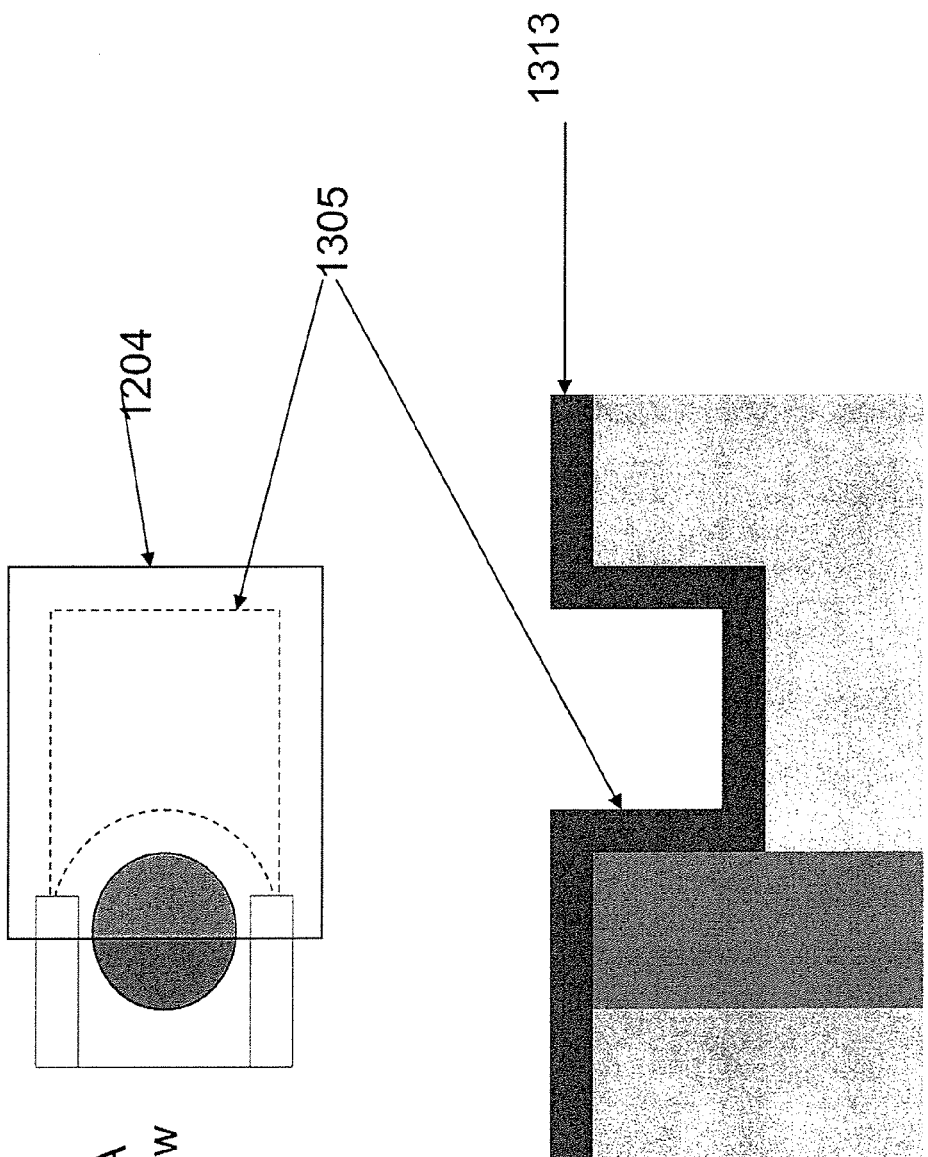
FIGS. 13A-B illustrate a structure when a conformal dielectric is deposited, according to some embodiments.

FIG. 11 illustrates a single electrode 101 formed in a dielectric 103. It is similar to the structure shown in FIG. 1, however in FIG. 12 an Interconnect Trench 1205 is formed. Though the figure shows the trench to be local to the electrode, it should be obvious to one skilled in the art that this trench pattern 1204 may extend as an interconnect to other regions on the die. The etching of the trench would use conventional dielectric etch technologies and preferably have vertical or near-vertical profiles. In some embodiments, the depth of the trench may be set based on the desired interconnect resistivity. While resistance of the trench drops with increased trench depth, the requirements of the circuit in which the switch is applied would dictate the resistance requirements. The trench resistance is significantly lower than the switch resistance, locally, so resistance requirements would be set by the design, layout, and performance needs of device applications After an Interconnect Trench formation a conformal dielectric is deposited. FIG. 13 illustrates the structure after a conformal dielectric 1313 is deposited. The thickness of the dielectric on the electrode sidewall will determine the CNT Circuit Element length dimension, "L". In some embodiments, conformalities (the ratio of the thickness on vertical surfaces versus that on horizontal surfaces) between about 0.25 and about 1 are possible, e.g., a conformality of about 1 preferred. However in some applications, conformality of about 0.75 is expected and may be used without negative impact. Higher conformality generally lowers the etch times (and hence nonuniformities) for removing the films from the horizontal surfaces. The Interconnect Trench region is smaller after the conformal dielectric 1313 is deposited. The dotted line in the top view portion of FIG. 13 shows the lateral edge 1305 of the dielectric deposition within the previously formed Interconnect Trench 1204.

FIG. 14 illustrates the structure when a metal deposition 1414 fills Interconnect Trenches. Various metal depositions to fill Interconnect Trenches may be used. Metal deposition area 1414 is bounded by lateral edges 1305. A useful metallurgy common in the industry is a CVD TiN deposition followed by a Tungsten deposition. Other possibilities are Aluminum, Copper, Gold, Silver, Tantalum, TaN, Ru, RuO, and combinations thereof as well as other metallurgies that may be or become known.

FIG. 15 illustrates the resulting structure after planarization of the metal and the trench dielectric is performed. The planarization (such as CMP) is designed to remove all metal from horizontal surfaces outside of the electrodes 101 and Interconnect Trenches 1515. Additionally, the planarization must remove the dielectric such that the electrodes are outwardly exposed. At the completion of this planarization process, both the electrodes 101 and the metal-filled Interconnect Trenches 1515 are exposed so that subsequent CNT application may make electrical connection to these features.

FIG. 16 illustrates the recess mask 1616 through which the trench dielectric that separates the conductive contact and the metal filled Interconnect Trench may be selectively removed. This will provide the voids 1617 over which the CNT "bridges" may be formed. The etch method and requirements of this recess are the same as those described for FIG. 2. In this case, the trench mask 1204 is open and underlying dielectric is removed in areas without overlying photoresist. It is useful to use an anisotropic etch to form substantially vertical walls though slight angles to vertical would be acceptable as well. The etch of the dielectric must be selective to the metal within the plugs such that very little of the metal is removed during the etch. Selectivities of at least 5:1 are acceptable with at least 20:1 being preferred. Note that the positioning of the trench mask pattern with respect to the previously formed vias is flexible.

Figures 17, 17A:
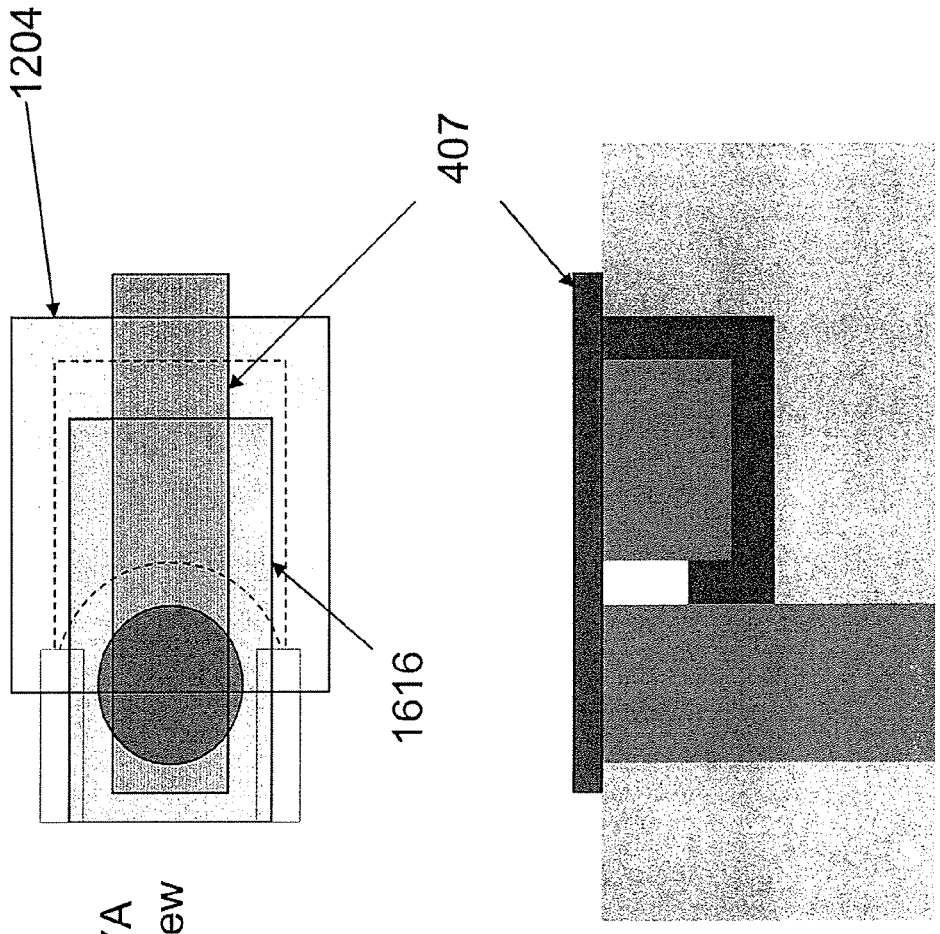

FIG. 17 illustrates the carbon nanotube layer 407 applied over the structure after the trench dielectric is selectively removed. FIG. 17 shows the formation of the CNT pattern using the same techniques applied in FIG. 4 above. The CNTs are patterned using conventional photolithographic methods and etched using methods known in the art and described extensively in U.S. Pat. No. 6,835,591.

Figure 18:
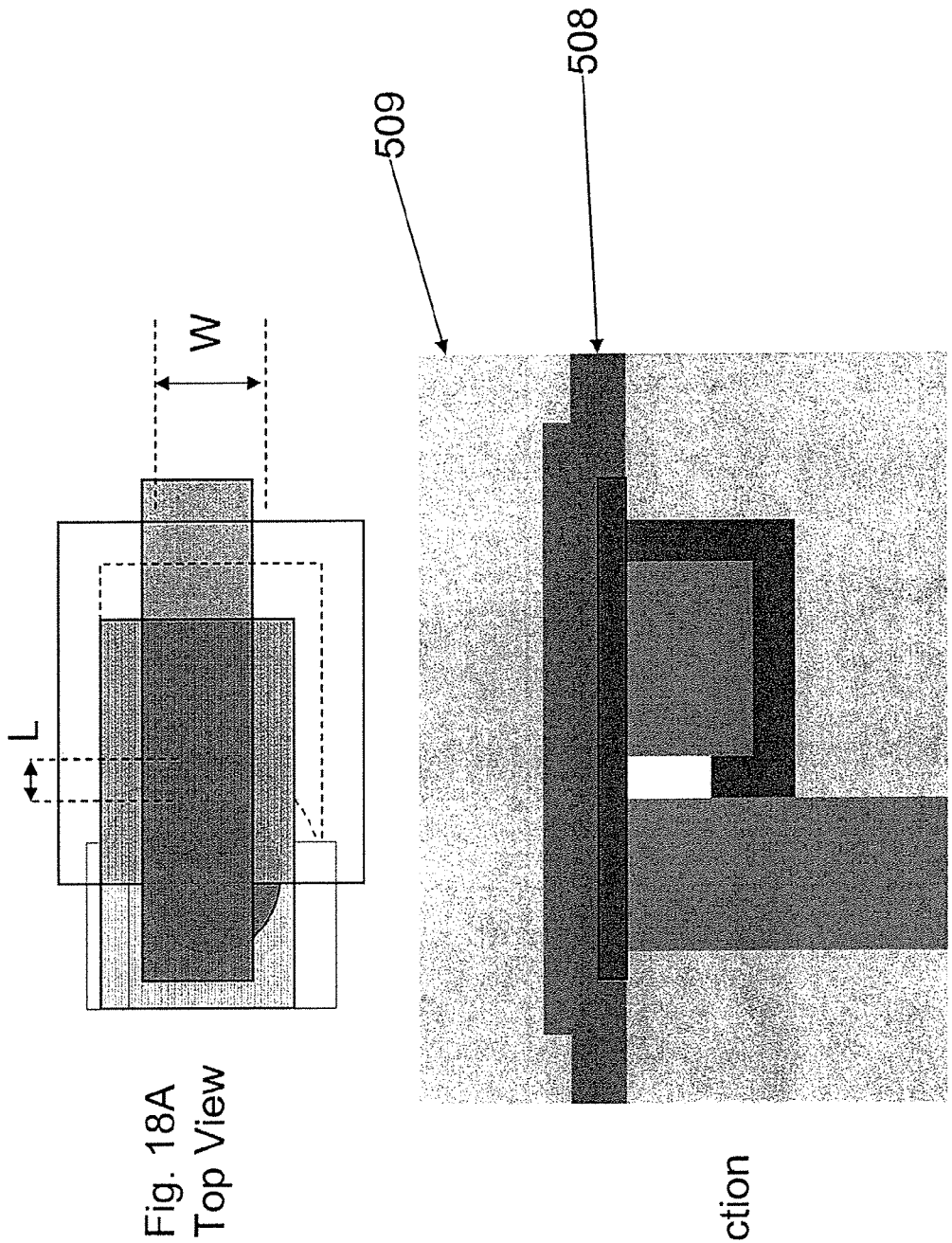
FIGS. 18A-B illustrate a structure when a passivating dielectric is deposited above a carbon nanotube layer and spans an electrode and an edge of an interconnect trench, according to some embodiments.

FIG. 18 illustrates embodiments of the structure upon completion of the passivation of the CNT Circuit Element, when the same requirements as those described for FIG. 5 are used. Passivation dielectric 508 and 509 are provided. In this case, the "L" of the CNT Circuit Element is defined by the lateral spacing of the electrode and the edge of the Interconnect Trench and more specifically is determined by the thickness of the trench dielectric along the sidewall of the electrode as described earlier. The "W" of the CNT Circuit Element is defined by the lithography as shown in the figure, however it would be obvious to one skilled in the art that any of the variations shown in FIGS. 6-10 may also be applied to this embodiment to provide advantages depending on the intended circuit application.

Figure 19:
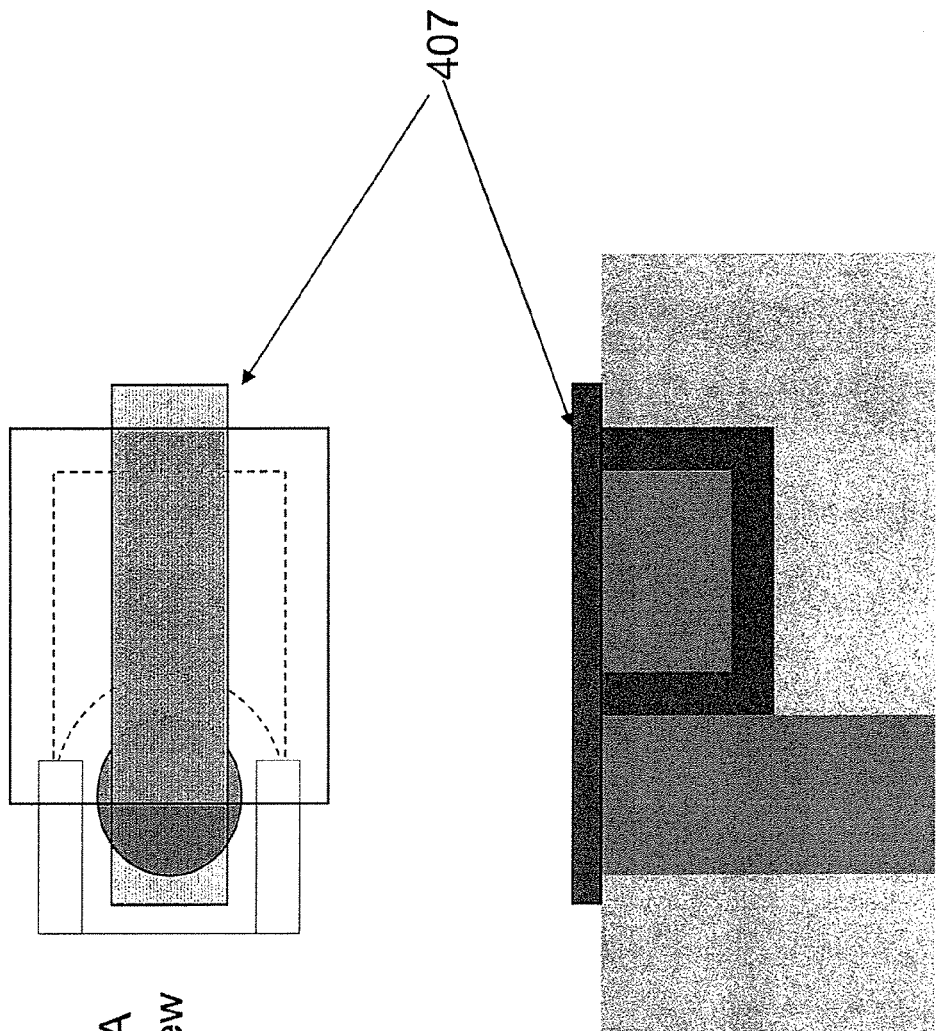
FIGS. 19A-B illustrate a structure when an alternate processing technique is used and a carbon nanotube layer is applied before a trench is formed, according to some embodiments.

FIG. 19 illustrates the structure when an alternate processing technique is used and the carbon nanotube layer 407 is applied before a trench is formed. This alternate approach follows the processing shown in FIG. 15. In this embodiment, the CNTs are applied and patterned before any void or recess is formed. A blanket recess may then be accomplished by using, for example, an isotropic etch of the trench dielectric that is selective to (does not remove) CNT or electrode material. Some embodiments would include providing a Borophosphosilicate glass (BPSG) or a Borosilicate Glass (BSG) as the trench dielectric within an undoped oxide dielectric providing a 10:1 etch rate of BSG:USG (Undoped Silicate Glass). Control of the etch recess would be by limiting the etch time such that only the desired recess is provided (for example, 300 Å).

FIG. 20 illustrates the structure when an alternative processing technique is used and the dielectric is selectively removed to form a trench 2019 after the carbon nanotube layer has been applied.

FIG. 21 illustrates the final structure after the passivation dielectric 509 has been deposited.

Structures Having Upper Void

Figure 22:
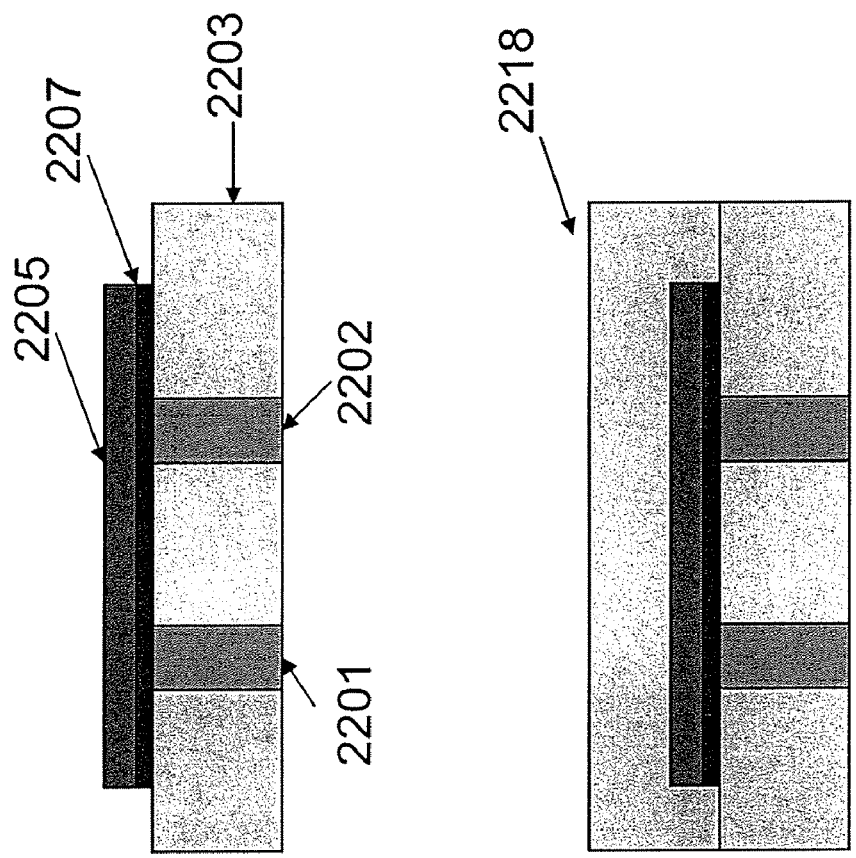
FIGS. 22A-E illustrate stages in the construction of a structure having an upper void structure, according to some embodiments.

Another embodiment features an upper void instead of a lower void structure, as illustrated in FIGS. 22A-E. FIG. 22A shows a structure where two metal electrodes 2201 and 2202 (either vias or lines) are patterned into an underlying dielectric substrate 2203. The carbon nanotube fabric 2207 is then deposited onto the substrate, followed by the deposition of a sacrificial hard mask material 2205. The sacrificial hard mask material may be any material that can be readily dry etched and wet etched—an example would be Al, TiN, Ti or TiW. The wet etch process most be selective only to the sacrificial material and not damage the CNTs or the surrounding substrate. The sacrificial hard mask material and the CNT fabric is then patterned using standard photolithography and RIE processes. It should be noted that the nanotube/hard mask pattern extends beyond the metal electrodes. For example, if the metal electrodes are 0.25 μm plugs that are separated by 0.25 μm, then the nanotube/hard mask pattern would extend beyond the bounds of the metal plugs by >0.25 μm. This is to prevent damage of the active region of the nanotube switch during subsequent processing described below.

After patterning the nanotube fabric and hard mask, a protective dielectric layer 2218 is deposited on top of the wafer, FIG. 22B. This layer acts as the passivation layer for the nanotube device.

Figure 22C:
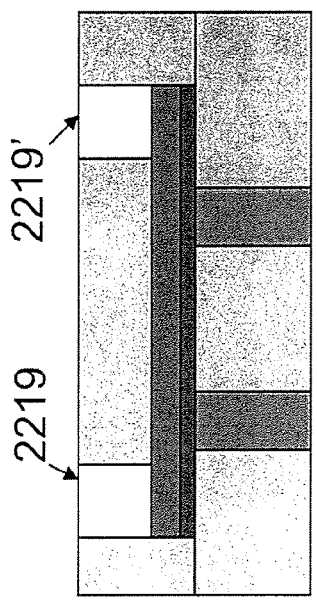

Vias 2219 and 2219' are then provided into the dielectric material down to the hard mask material, as shown in FIG. 22C. Selectivity to the sacrificial material is not required, because the sacrificial material will be removed during later processing and potential damage of the CNT fabric in this region will not affect the properties of the active switching region.

Figure 22D:
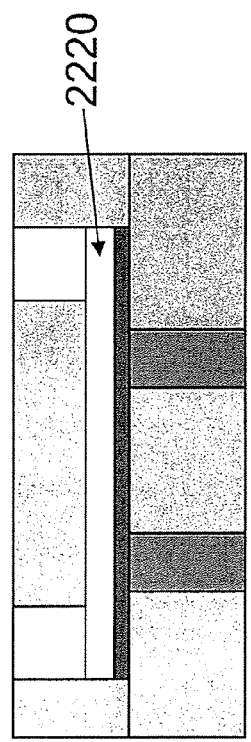

The sacrificial material can then be removed with an isotropic wet etch or dry etch as shown in FIG. 22D. An example of an isotropic dry etch is $XeF_2$ for etching of silicon, wherein the $XeF_2$ etch does not damage the CNTs. This process creates a cavity/void 2220 above the nanotube fabric where the switching can occur.

Figure 22E:
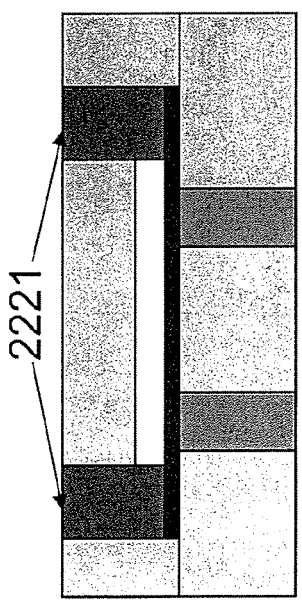

After the removal of the sacrificial material, the via openings 2219 and 2219' that were created in FIG. 22C can be back-filled with an appropriate dielectric material 2221 such as silicon dioxide or silicon nitride, FIG. 22E. A high deposition directionality is desirable; however, not required as long as the reactive species do not interact with the active region of the nanotube switch. For this step, techniques such as PECVD or PVD may be employed. Once the etch vias are filled in with a dielectric material, a vacuum or inert gas sealed cavity is created above the nanotube switching area. Further processing may also then commence.

Although not shown, a process for the creation of an upper and lower cavity may alternately be created by combing the upper cavity approach with the lower nanobridge approach.

Structures Having Double CNT Fabric Contact

FIGS. 23A-C detail another embodiment of the invention having a nanotube structure that utilizes two metal deposition steps to completely encapsulate the nanobridge structure or any nanotube nanoelectronic device. FIG. 23A shows an ideal representation of a deposited CNT 2307 on a substrate 2303 that has been coated with a metal 2301. In this representation, the CNT has a perfect circular circumference. However, several studies have shown that the ideal case shown in FIG. 23A does not give the best contact to CNTs. For example, Hertel T., et al., ("Deformation of carbon nanotubes by surface van der Waals forces", PRB, 58(20), 13870-13873, 1998) showed that CNTs will deform because of van der Waals forces acting between the carbon nanotube and the substrate. In the above-mentioned publication, Hertel stated that overlapping CNTs, which is common with Nantero's CNT fabric, will also cause further deformation of the circular structure of the surface. These deformations cause a 'flattening' of the nanotubes structure 2307' along the interface of the CNT and the substrate, as represented by FIG. 23B. This 'flattening' has the dual effect of increasing the contact resistance of the nanotube but also increasing the resistance of the nanotube due to the deformation of the structure of the nanotube. Appenzeller J., et al. ("Optimized contact configuration for the study of transport phenomena in ropes of single-wall carbon nanotubes," APL, 78 (21), 3313-3315, 2001) stated that sandwiching the CNTs between 2 metals 2301' and 2302 will reduce the contact resistance between the metal and the nanotube and also lower the resistance of the nanotube caused by the deformation of the nanotubes structure. Accordingly, FIG. 23C shows an exemplary metallization route for producing a low resistance nanotube fabric that can be used for nanoelectronic devices.

FIG. 24 shows a schematic representation of a nanobridge 2-Terminal NRAM device with metal-CNT fabric-metal contacts. To fabricate this device, the lower metal electrodes 2401 and 2402 are first constructed. Then the CNT fabric 2407 is deposited and patterned, followed by the deposition of the upper metal contact electrode 2401' and 2402'. Similar to the upper void structure detailed above, the upper contact metal can also be a hard mask for the patterning of the CNT fabric. A photolithography operation is then performed to pattern the upper metal contacts and the lower trench structure. The metal pattern and trench may defined by a wet etch process. However, in certain instances, it may be preferable to use a dry etch to pattern the upper metal contacts and the trench region. After the fabrication of the upper metal contacts and the nanobridge region, the passivation layers 2418 and 2421 are deposited as described above. In yet other embodiments, it may be preferable to employ other fabrication methods widely known in the art.

Alternate Embodiments

The term "CNT circuit element" should be understood to refer to any combination of memory elements, OTP (one time programmable) elements, or logic switches. This would further include memory elements, fuse elements, display elements, touchpad elements, and any other element including switchable CNTs.

In some embodiments, single walled carbon nanotubes may be preferred, and in other embodiments, multi-walled (e.g., double walled) carbon nanotubes, or a mixture of single-walled and multi-walled nanotubes, may be preferred. Also nanotubes may be used in conjunction with nanowires. Nanowires as mentioned herein is meant to mean single nanowires, aggregates of non-woven nanowires, nanoclusters, nanowires entangled with nanotubes comprising a nanofabric, mattes of nanowires, etc.

Interconnect wiring used to interconnect the nanotube device terminals may be conventional wiring such as AlCu, W, or Cu wiring with appropriate insulating layers such as $SiO_2$, polyimide, etc. The interconnect may also be single- or multi-wall nanotubes used for wiring.

Related Applications

This application is related to the following references, which are assigned to the assignee of this application and are hereby incorporated by reference herein in their entireties:

Electromechanical Memory Array Using Nanotube Ribbons and Method for Making Same (U.S. patent application Ser. No. 09/915,093, now U.S. Pat. No. 6,919,592), filed on Jul. 25, 2001;

Electromechanical Memory Having Cell Selection Circuitry Constructed With NT Technology (U.S. patent application Ser. No. 09/915,173, now U.S. Pat. No. 6,643,165), filed on Jul. 25, 2001;

Hybrid Circuit Having NT Electromechanical Memory (U.S. patent application Ser. No. 09/915,095, now U.S. Pat. No. 6,574,130), filed on Jul. 25, 2001;

Electromechanical Three-Trace Junction Devices (U.S. patent application Ser. No. 10/033,323, now U.S. Pat. No. 6,911,682), filed on Dec. 28, 2001;

Methods of Making Electromechanical Three-Trace Junction Devices (U.S. patent application Ser. No. 10/033,032, now U.S. Pat. No. 6,784,028), filed on Dec. 28, 2001;

Nanotube Films and Articles (U.S. patent application Ser. No. 10/128,118, now U.S. Pat. No. 6,706,402), filed on Apr. 23, 2002;

Methods of Nanotube Films and Articles (U.S. patent application Ser. No. 10/128,117, now U.S. Pat. No. 6,835,591), filed Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341,055), filed Jan. 13, 2003;

Methods of Using Pre-formed Nanotubes to Make Carbon Nanotube Films, Layers, Fabrics, Ribbons, Elements and Articles (U.S. patent application Ser. No. 10/341,054), filed Jan. 13, 2003;

Carbon Nanotube Films, Layers, Fabrics, Ribbons, Elements and Articles (U.S. patent application Ser. No. 10/341,130), filed Jan. 13, 2003;

Non-volatile Electromechanical Field Effect Devices and Circuits using Same and Methods of Forming Same (U.S. patent application Ser. No. 10/864,186), filed Jun. 9, 2004;

Devices Having Horizontally-Disposed Nanofabric Articles and Methods of Making the Same, (U.S. patent application Ser. No. 10/776,059, U.S. Patent Publication No. 2004/0181630), filed Feb. 11, 2004;

Devices Having Vertically-Disposed Nanofabric Articles and Methods of Making the Same (U.S. patent application Ser. No. 10/776,572, U.S. Patent Publication No. 2004/0175856), filed Feb. 11, 2004;

Patterned Nanoscopic Articles and Methods of Making the Same (U.S. patent application Ser. No. 10/936,119, now U.S. Patent Publication No. 2005/0128788), filed Sep. 8, 2004; and Nonvolatile Nanotube Diodes and Nonvolatile Nanotube Blocks and Systems Using Same and Methods of Making Same (U.S. patent application Ser. No. 11/835,651), filed Aug. 8, 2007.

The invention may be embodied in other specific forms without departing from the spirit or essential characteristics thereof. The present embodiments are therefore to be considered in respects as illustrative and not restrictive.

What is claimed is:

1. A two-terminal switching device, comprising:
   a first conductive terminal extending up from a substrate;
   a second conductive terminal extending up from the substrate, the second conductive terminal in spaced relation to the first terminal, wherein the spaced relation defines a void in the substrate;
   a nanotube article having at least one nanotube, said article being arranged to permanently contact at least a portion of the first and second terminals and partially suspended over the void; and
   a stimulus circuit in electrical communication with at least one of the first and second terminals,
      said stimulus circuit generating and applying selected waveforms to at least one of the first and second terminals to induce a change in the resistance of the device between the first and second terminals between a relatively low resistance and a relatively high resistance,
      wherein the relatively high resistance between the first and second terminals corresponds to a first state of the device, and wherein the relatively low resistance between the first and second terminals corresponds to a second state of the device.

2. The device of claim 1 wherein the void is bounded on a first side by the first conductive terminal and on a second side by the second conductive terminal.

3. The device of claim 1 wherein the void is bounded on a first side by one of the first and second conductive terminals and on a second side by a sidewall of substrate material.

4. The device of claim 1 wherein the void is bounded on a first side by a first sidewall of substrate material and on a second side by a second sidewall of substrate material, the first sidewall of substrate material forming a thin insulating layer over the first conductive terminal and the second sidewall of substrate material forming a thin insulating layer over the second conductive terminal.

5. The device of claim 1, wherein the first and second conductive terminals comprise at least one of Al, Cu, W, Co, Ti, Ta, TiW, $CoSi_x$, $WSi_2$, $TiSi_x$, TaN, TiN, TiAlN, Au, Ag, Ru, and RuO.

6. The device of claim 1 further comprising a dielectric material disposed over the nanotube article and substantially sealing the void.

7. The device of claim 6, wherein the dielectric material comprises at least one of $Si_3N_4$, $SiO_2$, Tetraethyl orthosilicate, Phosphosilicate glass, $Al_2O_3$, $HfO_2$, $ZrO_2$, SiCN, and SiON.

8. The device of claim 1 wherein the nanotube article comprises a patterned region of nanotube fabric.

9. The device of claim 8, wherein when the device is in the relatively low resistance state, the nanotube fabric provides a plurality of electrically conductive pathways between the first and second conductive terminals.

10. The device of claim 8, wherein the nanotube fabric comprises a multilayered fabric.

11. The device of claim 8, wherein the nanotube fabric comprises a substantially monolayer of unaligned nanotubes.

12. The device of claim 1, wherein the nanotube article comprises an active region suspended over the void, and wherein the relatively high and relatively low resistances between the first and second terminals correspond to relatively high and relatively low resistance values of the active region.

13. The device of claim 1, wherein the stimulus circuit further comprises a circuit for reading the first and second states of the device without substantially altering the relatively high and relatively low resistance between the first and second terminals.

14. The device of claim 1, wherein the first and second states of the device are nonvolatile.

15. The device of claim 1 wherein the nanotube article completely overlaps an upper surface of at least one of the first and second terminals.

16. The device of claim 1, wherein the at least one nanotube is substantially encapsulated in a metal material, the at least one nanotube having a cross-sectional dimension that substantially deforms in one of the first and second states of the device.

17. A nanotube switching device, comprising:
a conductive terminal extending up from a substrate, the conductive terminal defining a first boundary of a void and a vertical wall of substrate material defining a second boundary of a void;
an interconnect line disposed in the void, providing an electrical communication pathway to and from external circuitry;
a nanotube article having an unaligned network of nanotubes, said article being arranged to permanently contact at least a portion of each of the conductive terminal and the interconnect line, and suspended over the void; and
a stimulus circuit in electrical communication with conductive terminals,
said stimulus circuit generating and applying waveforms to the conductive terminal to induce a change in the resistance of the nanotube article between a relatively low resistance and a relatively high resistance, wherein the relatively high resistance corresponds to a first state of the device, and wherein the relatively low resistance corresponds to a second state of the device.

18. The device of claim 17, wherein the at least one of the conductive terminal and the interconnect line comprises one or more of the following materials: Al, Cu, W, Co, Ti, Ta, TiW, $CoSi_x$, $WSi_2$, $TiSi_x$, TaN, TiN, TiAlN, Au, Ag, Ru, and RuO.

19. The device of claim 17 further comprising a dielectric material disposed over the nanotube article and substantially sealing the void in the substrate.

20. The device of claim 19, wherein the dielectric material comprises at least one of $Si_3N_4$, $SiO_2$, Tetraethyl orthosilicate, Phosphosilicate glass, $Al_2O_3$, $HfO_2$, $ZrO_2$, SiCN, and SiON.

21. The device of claim 17, wherein the nanotube article comprises a multilayered nanotube fabric.

22. The device of claim 17, wherein the nanotube article comprises a substantially monolayer of unaligned nanotubes.

23. The device of claim 17, wherein the network of unaligned nanotubes provides one or more electrically conductive pathways between the conductive terminal and the interconnect line, the electrically conductive pathways forming and unforming in response to the waveforms.

24. The device of claim 17, wherein the unaligned network of nanotubes providing the electrically conductive pathways between the conductive terminal and the interconnect line comprise an active region of the nanotube article.

25. The device of claim 17, wherein a reading electrical stimulus on the interconnect line does not substantially alter the relatively high and relatively low resistance of the nanotube article.

26. The device of claim 17, wherein the first and second states of the device are nonvolatile.

27. A method of fabricating a nanotube switching device, comprising:
embedding at least one electrode in a substrate;
forming a patterned region of nanotube fabric, the patterned region of nanotube fabric being arranged to permanently contact at least a portion of the electrode;
removing a selected portion of the substrate, adjacent to the at least one electrode, to define a void in the substrate bounded in part by the electrode, such that the patterned region of nanotube fabric forms another boundary of the void in the substrate; and
providing a stimulus circuit in electrical communication with the at least one electrode,
said stimulus circuit generating and applying one or more waveforms to the at least one electrode to induce a change in the resistance of the patterned region of nanotube fabric between a relatively low resistance and a relatively high resistance,
wherein the relatively high resistance corresponds to a first state of the device, and wherein the relatively low resistance corresponds to a second state of the device.

28. The method of claim 27, further comprising providing substrate material overlying the nanotube fabric, and wherein defining a void comprises removing substrate material overlaying the patterned region of nanotube fabric, subsequent to forming the patterned region of nanotube fabric.

29. The method of claim 28, wherein embedding at least one electrode in the substrate comprises substantially sealing the void in the substrate.

30. The method of claim 27, wherein forming the patterned region of nanotube fabric comprises suspending the patterned region of nanotube fabric over the void.

31. The method of claim 27, further comprising disposing a dielectric layer over the patterned region of nanotube fabric, wherein the dielectric layer substantially seals the void in the substrate.

32. The method of claim 31, wherein the nanotube fabric is substantially porous.

33. The method of claim 27, wherein the nanotube fabric comprises a multilayered fabric.

34. The method of claim 27, wherein the nanotube fabric comprises a substantially monolayer of unaligned nanotubes.

35. The method of claim 27, wherein embedding at least one electrode in a substrate comprises planarizing an upper surface of the substrate and the at least one electrode.

36. The method of claim 27, wherein removing a defined portion of the substrate comprises an etching step selected to substantially preserve the at least one electrode.

37. The method of claim 27, wherein forming the patterned region of nanotube fabric comprises one of a spin coating and a spray coating step.

38. The method of claim 37, wherein each of the spin coating and spray coating steps comprises applying nanotubes having a length substantially longer than a lateral dimension of the void.

39. The method of claim 27, wherein forming a patterned region of nanotube fabric comprises: filling the void with a sacrificial material; forming a nanotube fabric over the sacrificial material and the at least one electrode; patterning and etching the nanotube fabric to form the patterned region; and removing the sacrificial material to suspend the patterned region of nanotube fabric over the void.

40. The method of claim 27, wherein the at least one electrode comprises a first and second electrode.

41. The method of claim 27, further comprising forming an interconnect line disposed in the void, providing an electrical communication pathway to and from external circuitry.

* * * * *